United States Patent
Das et al.

(10) Patent No.: US 9,425,414 B2
(45) Date of Patent: Aug. 23, 2016

(54) ORGANOMETALLIC COMPLEXES, AND ORGANIC ELECTROLUMINESCENCE DEVICE AND DISPLAY USING THE SAME

(71) Applicants: SAMSUNG ELECTRONICS CO., LTD., Suwon-si, Gyeonggi-do (KR); CHEIL INDUSTRIES INC., Gumi-si, Gyeongsangbuk-do (KR)

(72) Inventors: Rupasree Ragini Das, Suwon-si (KR); Chang Ho Noh, Suwon-si (KR); Dmitry Kravchuk, Hwaseong-si (KR); O Hyun Kwon, Yongin-si (KR); Hyeon Ho Choi, Seoul (KR)

(73) Assignees: SAMSUNG ELECTRONICS CO., LTD. (KR); CHEIL INDUSTRIES INC. (KR)

( * ) Notice: Subject to any disclaimer, the term of this patent is extended or adjusted under 35 U.S.C. 154(b) by 408 days.

(21) Appl. No.: 14/062,506

(22) Filed: Oct. 24, 2013

(65) Prior Publication Data

US 2014/0124760 A1    May 8, 2014

(30) Foreign Application Priority Data

Nov. 2, 2012    (KR) .................. 10-2012-0123653

(51) Int. Cl.
*H01L 51/00* (2006.01)
*C09K 11/06* (2006.01)
*H01L 51/50* (2006.01)

(52) U.S. Cl.
CPC ........... *H01L 51/0085* (2013.01); *C09K 11/06* (2013.01); *C09K 2211/1011* (2013.01);
(Continued)

(58) Field of Classification Search
None
See application file for complete search history.

(56) References Cited

U.S. PATENT DOCUMENTS 6,911,271 B1   6/2005   Lamansky et al.
6,939,624 B2   9/2005   Lamansky et al.
(Continued)

FOREIGN PATENT DOCUMENTS

JP    2008-074921 A    4/2008
KR    1020050053994 A    6/2005
(Continued)

OTHER PUBLICATIONS

Adachi et al, "High-efficiency organic electrophosphorescent devices with tris(2-phenylpyridine)iridium doped into electron-transporting materials", Applied Physics Letters, vol. 77, No. 6, Aug. 7, 2000, pp. 904-906.

(Continued)

*Primary Examiner* — J. L. Lang
(74) *Attorney, Agent, or Firm* — Cantor Colburn LLP

(57) ABSTRACT

Disclosed are an organometallic complex, and an organic electroluminescence device and a display device including the same. The organometallic complex is represented by the following Chemical Formula 1.

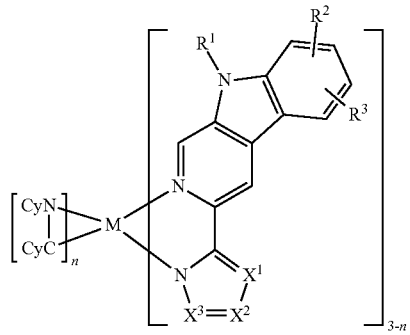

Chemical Formula 1

The definition of the above Chemical Formula 1 is the same as described in the detailed description.

16 Claims, 4 Drawing Sheets

(52) U.S. Cl.
CPC ............ *C09K2211/1029* (2013.01); *C09K 2211/1044* (2013.01); *C09K 2211/185* (2013.01); *H01L 51/5016* (2013.01)

(56) References Cited

U.S. PATENT DOCUMENTS

| | | | |
|---|---|---|---|
| 7,381,479 | B2 | 6/2008 | Lamansky et al. |
| 7,482,451 | B2 | 1/2009 | Thompson et al. |
| 7,687,626 | B2 | 3/2010 | Ragini et al. |
| 7,776,458 | B2 | 8/2010 | Ragini et al. |
| 2002/0048689 | A1 | 4/2002 | Igarashi et al. |
| 2002/0064681 | A1 | 5/2002 | Takiguchi et al. |
| 2004/0102632 | A1 | 5/2004 | Thompson et al. |
| 2005/0214576 | A1 | 9/2005 | Lamansky et al. |
| 2007/0020479 | A1 | 1/2007 | Uetani et al. |
| 2008/0281098 | A1 | 11/2008 | Lamansky et al. |
| 2009/0111989 | A1 | 4/2009 | Thompson et al. |
| 2009/0200920 | A1 | 8/2009 | Jin et al. |
| 2011/0282059 | A1 | 11/2011 | Baranoff et al. |
| 2012/0161612 | A1 | 6/2012 | Kim et al. |

FOREIGN PATENT DOCUMENTS

| | | |
|---|---|---|
| KR | 1020060006836 A | 1/2006 |
| KR | 1020060011933 A | 2/2006 |
| KR | 1020080039056 A | 5/2008 |
| KR | 1020080066672 A | 7/2008 |
| KR | 1020110131200 A | 12/2011 |
| WO | 0215645 A1 | 2/2002 |

OTHER PUBLICATIONS

Adachi et al., "High-efficiency red electrophosphorescence devices", Applied Physics Letters, vol. 78, No. 11, Mar. 12, 2001, pp. 1622-1624.

Baldo et al., "Very high-efficiency green organic light-emitting devices based on electrophosphorescence", Applied Physics Letters, vol. 75, No. 1, Jul. 5, 1999, pp. 4-6.

Baldo et al., "Highly efficient phosphorescent emission from organic electroluminescent devices", Nature, vol. 395, Sep. 10, 1998, pp. 151-154.

Das et al., "Electrophosphorescent Light Emitting Devices Using New Indium(III) complexes", Mat. Res. Soc. Symp. Proc. vol. 708, 2002, pp. BB3.39.1-BB3.39.6.

Garces et al., "Synthesis, Structure, Electrochemistry, and Photophysics of Methyl-Substituted Phenylpyridine Ortho-Metalated Iridium (III) Complexes", Inorg. Chem. vol. 27, 1988, pp. 3464-3471.

ORGANOMETALLIC COMPLEXES, AND ORGANIC ELECTROLUMINESCENCE DEVICE AND DISPLAY USING THE SAME

CROSS-REFERENCE TO RELATED APPLICATION

This application claims priority to Korean Patent Application No. 10-2012-0123653, filed on Nov. 2, 2012, and all the benefits accruing therefrom under 35 U.S.C. §119, the content of which in its entirety is herein incorporated by reference.

BACKGROUND

1. Field

An organometallic complex, an organic electroluminescence device, and a display device using the same are disclosed.

2. Description of the Related Art

An organic electroluminescence device is a display element that actively emits light when a current flows into a fluorescent or phosphorescent organic compound thin layer (hereinafter, an organic layer), so that electrons and holes are combined in the organic layer. The organic electroluminescence device is light. It consists of simple parts and has a simple structure for manufacturing. The organic electroluminescence device can secure high image quality and a wide viewing angle. In addition, the organic electroluminescence device may perfectly realize high color purity and a motion picture, and has appropriate electrical characteristics of low power consumption and low voltage driving for a portable electronic device.

In general, the organic electroluminescence device includes an anode on a substrate, a hole transport layer ("HTL"), an emission layer, an electron transport layer ("ETL"), and a cathode sequentially formed on the anode. Herein, the hole transport layer (HTL), the emission layer, and the electron transport layer (ETL) are organic layers formed of an organic compound. The organic electroluminescence device operates as follows. When a voltage is applied between the anode and the cathode, holes injected from the anode pass through the hole transport layer (HTL) and move toward the emission layer. On the other hand, electrons pass through the electron transport layer (ETL) from the cathode and are injected into the emission layer, in which the carriers are recombined and produce exitons. The exitons are radioactively decayed and emit light with a wavelength corresponding to the band gap of a used material.

The emission layer may be formed of a phosphor material using singlet exitons or a phosphorescence material using triplet exitons depending on a light emitting mechanism thereof. The phosphor material or phosphorescent material itself doped on an appropriate host material may be used to form the emission layer. When electrons are excited, singlet and triplet exitons are formed on the host material. Herein, the singlet and triplet exitons are produced in a ratio of about 1:3.

When the phosphor material is used as an emission layer-forming material, an organic electroluminescence device wastes triplet exitons produced from a host material. However, when the phosphorescent material is used as the emission layer-forming material, both singlet and triplet exitons may be used and reach 100% internal quantum efficiency. Accordingly, the phosphorescent material may have higher luminous efficiency than the phosphor material.

On the other hand, when a heavy metal such as Ir, Pt, Rh, and Pd is introduced into an organic molecule, the singlet and triplet exitons are spin-orbitally coupled and mixed due to heavy atom effects, and are thus transferred and effectively become phosphorescent even at room temperature.

As aforementioned, various materials using a transition element compound including a transition element such as iridium, platinum, and the like have been reported as a phosphorescent light emitting material with high efficiency. However, a more efficient phosphorescent material for a full color display element still needs to be developed.

SUMMARY

An embodiment of the present disclosure provides an organometallic complex that efficiently emits light.

In addition, another embodiment of the present disclosure provides an organic electroluminescence device using the organometallic complex.

Still another embodiment of the present disclosure provides a display device including the organic electroluminescence device.

According to an embodiment of the present disclosure, an organometallic complex represented by the following Chemical Formula 1 is provided.

Chemical Formula 1

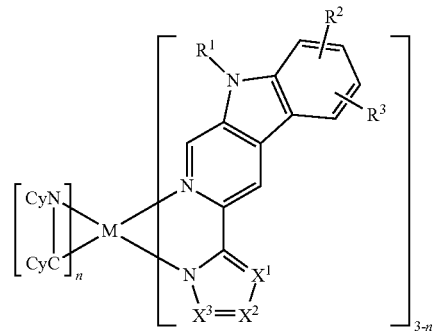

In Chemical Formula 1, M is Ir, Os, Pt, Pb, Re, Ru, or Pd, CyN-M-CyC forms a heterocyclic ring and CyN—CyC is a cyclometalating ligand bonded with M through a nitrogen atom and a carbon atom; or CyN is a substituted or unsubstituted C2 to C60 heterocyclic group including a nitrogen atom bonded with M or a substituted or unsubstituted C3 to C60 heteroaryl group including a nitrogen atom bonded with M, CyC is a substituted or unsubstituted C4 to C60 carbon cyclic group including a carbon atom bonded with M, a substituted or unsubstituted C3 to C60 heterocyclic group including a carbon atom bonded with M, a substituted or unsubstituted C3 to C60 aryl group including a carbon atom bonded with M, a substituted or unsubstituted C7 to C60 arylalkyl group including a carbon atom bonded with M, or a substituted or unsubstituted C3 to C60 heteroaryl group including a carbon atom bonded with M, and CyN—CyC is a cyclometalating ligand bonded with M through a nitrogen atom and a carbon atom, $X^1$ to $X^3$ are independently N or CR', provided at least one of $X^1$ to $X^3$ is N, $R^1$ to $R^3$ and R' are independently hydrogen, deuterium, a halogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C2 to C30 alkenyl group, a substituted or unsubstituted C6 to C30 aryl group, a substituted or unsubstituted C1 to C30 heteroaryl group, a substituted or unsubstituted C1 to C30 amino group, SF$_5$, a trialkylsilyl group having a substituted or unsubstituted C1 to C30 alkyl group, a dialkylarylsilyl group having a substituted or unsubstituted C1 to C30 alkyl group and a C6 to C30 aryl group, a triarylsilyl group having a substituted or unsubstituted C6 to C30 aryl group, a substituted or unsubstituted diaryl boronyl, or at least two of R$^1$ to R$^3$ are fused to form a fused ring, and n is an integer ranging from 0 to 2.

The organometallic complex may be represented by the following Chemical Formula 2.

Chemical Formula 2

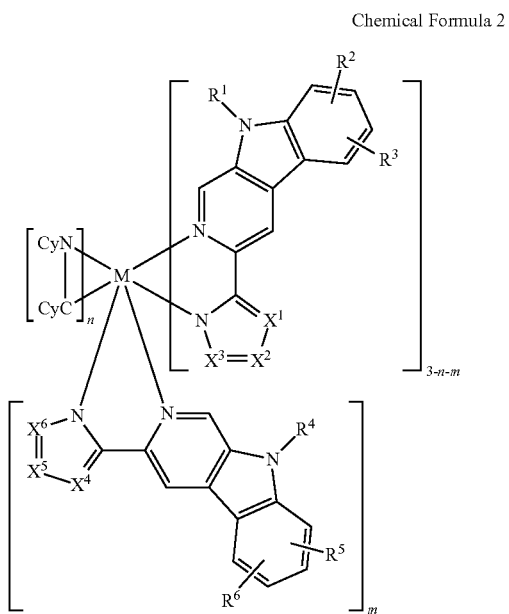

In Chemical Formula 2, M is Ir, Os, Pt, Pb, Re, Ru, or Pd, CyN-M-CyC forms a heterocyclic ring and CyN—CyC is a cyclometalating ligand bonded with M through a nitrogen atom and a carbon atom; or CyN is a substituted or unsubstituted C2 to C60 heterocyclic group including a nitrogen atom bonded with M or a substituted or unsubstituted C3 to C60 heteroaryl group including a nitrogen atom bonded with M, CyC is a substituted or unsubstituted C4 to C60 carbon cyclic group including a carbon atom bonded with M, a substituted or unsubstituted C3 to C60 heterocyclic group including a carbon atom bonded with M, a substituted or unsubstituted C3 to C60 aryl group including a carbon atom bonded with M, a substituted or unsubstituted C7 to C60 arylalkyl group including a carbon atom bonded with M, or a substituted or unsubstituted C3 to C60 heteroaryl group including a carbon atom bonded with M, and CyN—CyC is a cyclometalating ligand bonded with M through a nitrogen atom and a carbon atom, X$^1$ to X$^6$ are independently N or CR', provided at least one of X$^1$ to X$^3$ is N and at least one of X$^4$ to X$^6$ is N, R$^1$ to R$^6$ and R' are independently hydrogen, deuterium, a halogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C2 to C30 alkenyl group, a substituted or unsubstituted C6 to C30 aryl group, a substituted or unsubstituted C1 to C30 heteroaryl group, a substituted or unsubstituted C1 to C30 amino group, SF$_5$, a trialkylsilyl group having a substituted or unsubstituted C1 to C30 alkyl group, a dialkylarylsilyl group having a substituted or unsubstituted C1 to C30 alkyl group and a C6 to C30 aryl group, a triarylsilyl group having a substituted or unsubstituted C6 to C30 aryl group, a substituted or unsubstituted diaryl boronyl, or at least two of R$^1$ to R$^6$ are fused to form a fused ring, n and m are independently integers ranging from 0 to 2, and m+n≤3.

The organometallic complex may be represented by the following Chemical Formula 3.

Chemical Formula 3

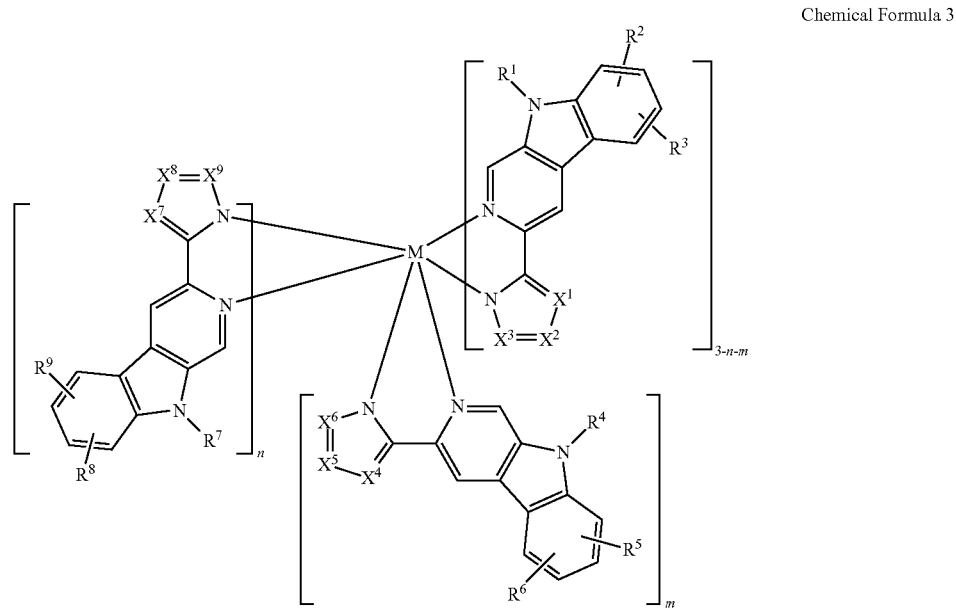

In Chemical Formula 3, M is Ir, Os, Pt, Pb, Re, Ru, or Pd, $X^1$ to $X^9$ are independently N or CR', at least one of $X^1$ to $X^3$ is N, at least one of $X^4$ to $X^6$ is N, is N, at least one of $X^7$ to $X^9$ is N, $R^1$ to $R^9$ and R' are independently hydrogen, deuterium, a halogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C2 to C30 alkenyl group, a substituted or unsubstituted C6 to C30 aryl group, a substituted or unsubstituted C1 to C30 heteroaryl group, a substituted or unsubstituted C1 to C30 amino group, $SF_5$, a trialkylsilyl group having a substituted or unsubstituted C1 to C30 alkyl group, a dialkylarylsilyl group having a substituted or unsubstituted C1 to C30 alkyl group and a C6 to C30 aryl group, a triarylsilyl group having a substituted or unsubstituted C6 to C30 aryl group, a diaryl boronyl, substituted diaryl boronyl, or $R^1$ to $R^9$ are fused to form a fused ring, n and m are independently integers ranging from 0 to 2, and m+n≤3.

The cyclometalating ligand (CyN—CyC) in formula (1) or formula (2) may be one of the following chemical formulae.

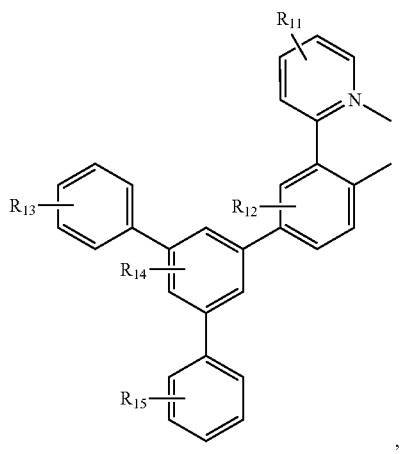
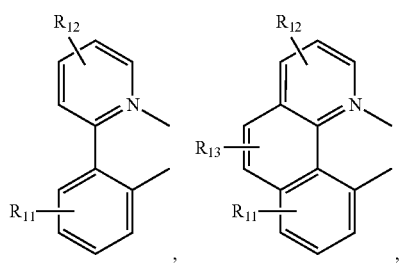
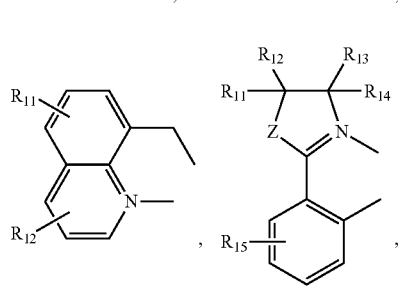
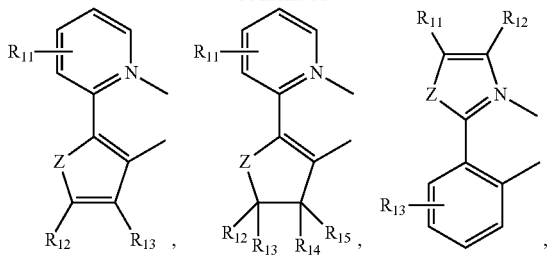
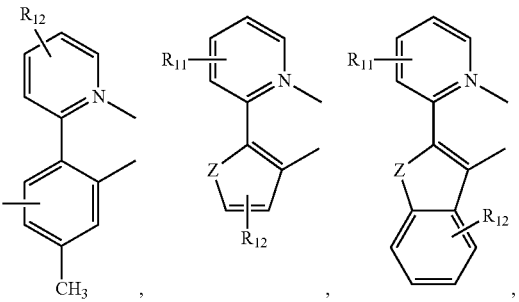
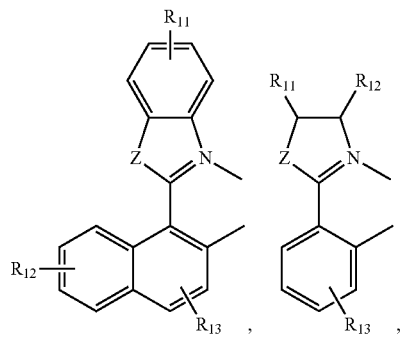
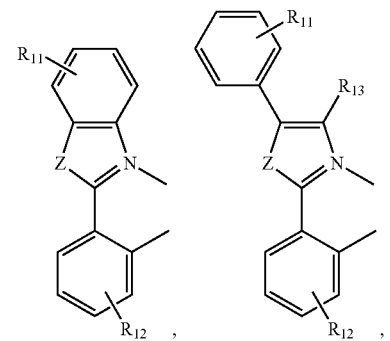
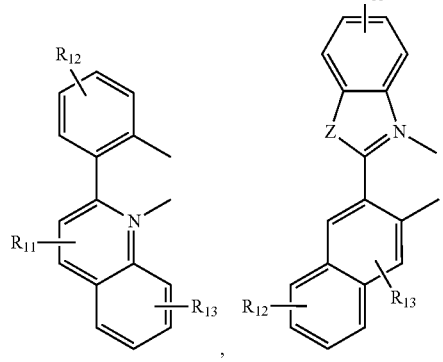

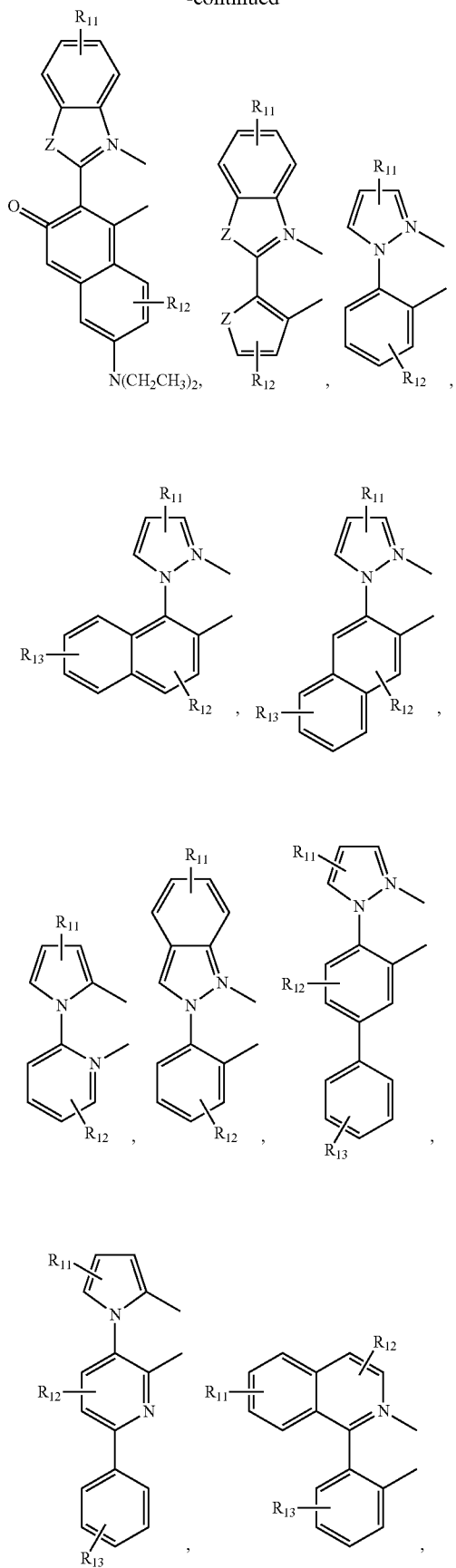

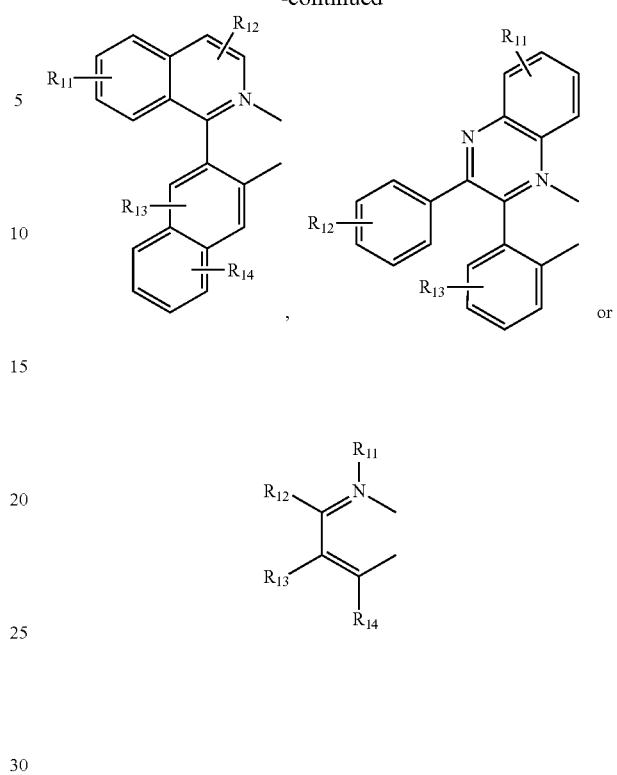

In the above chemical formulae, $R^{11}$, $R^{12}$, $R^{13}$, $R^{14}$, and $R^{15}$ are independently hydrogen, a halogen, —OR, —N(R)$_2$, —P(R)$_2$, —POR, —PO$_2$R, —PO$_3$R, —SR, —Si(R)$_3$, —B(R)$_2$, —B(OR)$_2$, —C(O)R, —C(O)OR, —C(O)N(R), —CN, —NO$_2$, —SO$_2$, —SOR, —SO$_2$R, —SO$_3$R, a C1 to C20 alkyl group, or a C6 to C20 aryl group, wherein R is hydrogen, deuterium, a halogen, a substituted or unsubstituted C1 to C20 alkyl group, a substituted or unsubstituted C1 to C10 alkoxy group, a substituted or unsubstituted C2 to C20 alkenyl group, a substituted or unsubstituted C2 to C20 alkynyl group, a substituted or unsubstituted C1 to C20 heteroalkyl group, a substituted or unsubstituted C6 to C40 aryl group, a substituted or unsubstituted C7 to C40 arylalkyl group, a substituted or unsubstituted C7 to C40 alkylaryl group, a substituted or unsubstituted C2 to C40 heteroaryl group, or a substituted or unsubstituted C3 to C40 heteroarylalkyl group, and Z is S, O, or NR$^0$ wherein R$^0$ is hydrogen or a C1 to C20 alkyl group.

The M may be Ir or Pt.

At least two of $X^1$ to $X^3$ may be N.

All of $X^1$ to $X^3$ may be N.

At least two of $X^1$ to $X^3$ may be N, and at least two of $X^4$ to $X^6$ may be N.

All of $X^1$ to $X^3$ may be N, and all of $X^4$ to $X^6$ may be N.

At least two of $X^1$ to $X^3$ may be N, At least two of $X^4$ to $X^6$ may be N, and at least two of $X^7$ to $X^9$ may be N.

All of $X^1$ to $X^3$ may be N, all of $X^4$ to $X^6$ may be N, and all of $X^7$ to $X^9$ may be N.

The compound represented by the above Chemical Formula 1 may be represented by one of the following Chemical Formulae A-1 to A-7.

Chemical Formula A-1

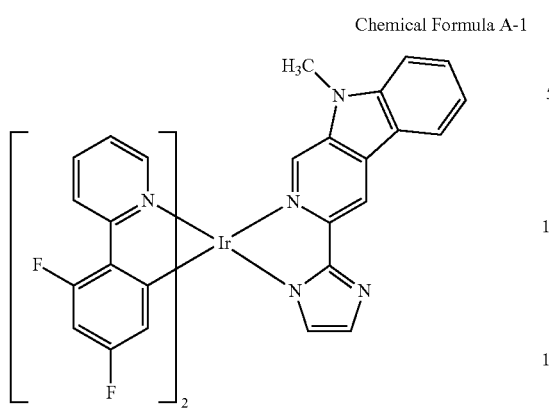

Chemical Formula A-2

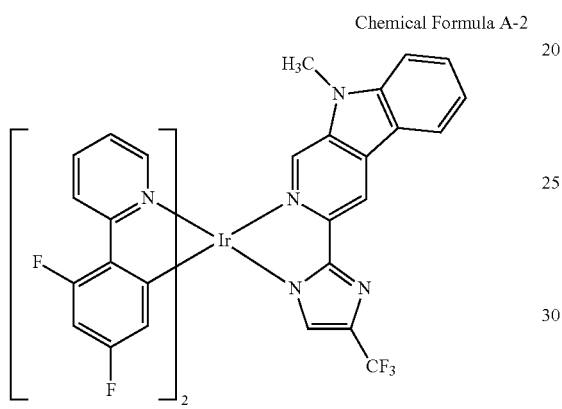

Chemical Formula A-3

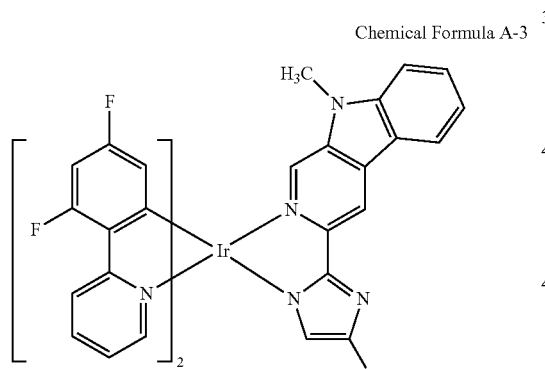

Chemical Formula A-4

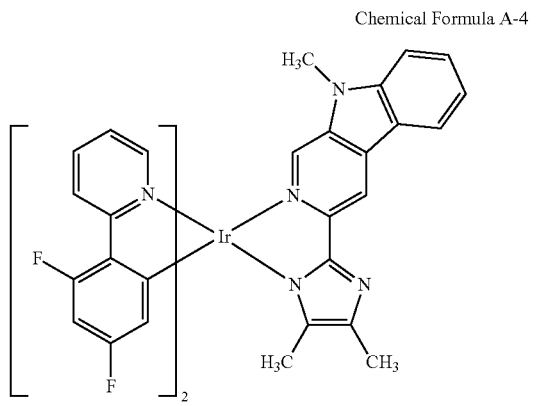

Chemical Formula A-5

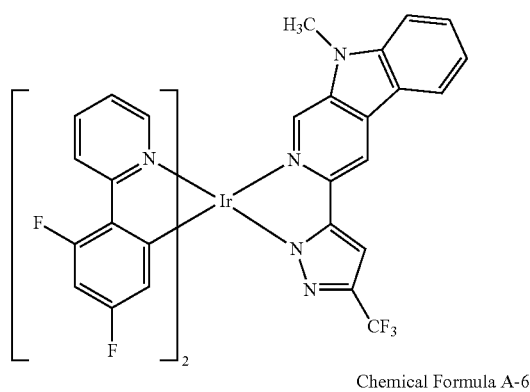

Chemical Formula A-6

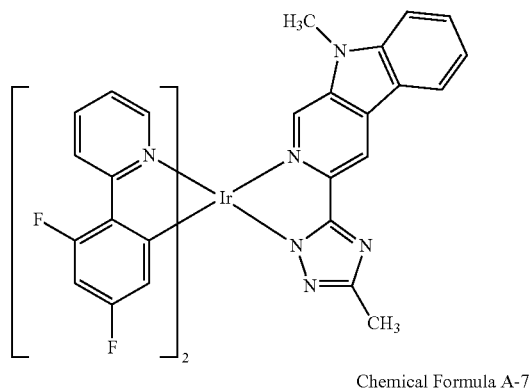

Chemical Formula A-7

According to another embodiment, an organic electroluminescence device including an organic layer between a pair of electrodes, wherein the organic layer includes the organometallic complex according to any one of formulae 1 to 3, is provided.

The organic layer may be an emission layer.

The organometallic complex may be included in an amount of about 1 to about 30 parts by weight based on 100 parts by weight of an emission layer-forming material.

According to yet another embodiment, a display device including the organic electroluminescence device is provided.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1A:
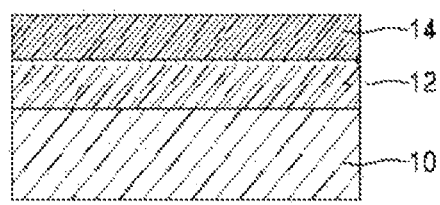
FIGS. 1A to 1F schematically show the lamination structure of an organic electroluminescence device according to an embodiment of the disclosure.

This disclosure will be described more fully hereinafter with reference to the accompanying drawings, in which exemplary embodiments are shown. This disclosure may, however, be embodied in many different forms and is not to be construed as limited to the exemplary embodiments set forth herein.

It will be understood that when an element is referred to as being "on" another element, it may be directly on the other element or intervening elements may be present therebetween. In contrast, when an element is referred to as being "directly on" another element, there are no intervening elements present. It will be understood that, although the terms first, second, third etc. may be used herein to describe various elements, components, regions, layers and/or sections, there elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a", "an" and "the" are intended to include the plural forms as well, unless the context clearly indicates otherwise. The term "or" means "and/or." As used herein, the term "and/or" includes any and all combinations of one or more of the associated listed items. Expressions such as "at least one of," when preceding a list of elements, modify the entire list of elements and do not modify the individual elements of the list.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may typically have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, the term "substituted" refers to s substituent or a compound substituted with at least a group selected from deuterium, a halogen, a hydroxyl group, an amino group, a substituted or unsubstituted C1 to C30 amine group, a nitro group, a substituted or unsubstituted C3 to C40 silyl group, a C1 to C30 alkyl group, a C1 to C10 alkylsilyl group, a C3 to C30 cycloalkyl group, a C6 to C30 aryl group, a C1 to C20 alkoxy group, a fluoro group, a C1 to C10 trifluoroalkyl group such as a trifluoromethyl group, or a cyano group, instead of at least one hydrogen of the substituent or the compound.

Two adjacent substituents of the substituted halogen, hydroxyl group, amino group, substituted or unsubstituted C1 to C20 amine group, nitro group, substituted or unsubstituted C3 to C40 silyl group, C1 to C30 alkyl group, C1 to C10 alkylsilyl group, C3 to C30 cycloalkyl group, C6 to C30 aryl group, C1 to C20 alkoxy group, fluoro group, C1 to C10 trifluoroalkyl group such as a trifluoromethyl group, and cyano group may be fused to form a ring.

As used herein, when specific definition is not otherwise provided, the term "hetero" refers to a substituent, group, or compound including at least one heteroatom selected from N, O, S, and P, for example including 1 to 3 heteroatoms.

As used herein, when specific definition is not otherwise provided, the term "combination thereof" when used in the context of substituents or groups may refer to two or more substituents being bound through a linking group, or two or more substituents condensed to each other.

As used herein, when specific definition is not otherwise provided, the term "alkyl group" refers to an aliphatic hydrocarbon group. The alkyl group may be any "saturated alkyl group" without a double bond or a triple bond.

The alkyl group may be a C1 to C20 alkyl group. The alkyl group may be a C1 to C10 alkyl group or a C1 to C6 alkyl group. For example, a C1 to C4 alkyl group may have 1 to 4 carbon atoms and may be selected from methyl, ethyl, propyl, iso-propyl, n-butyl, iso-butyl, sec-butyl, and t-butyl.

Examples of the alkyl group may be a methyl group, an ethyl group, a propyl group, an isopropyl group, a butyl group, an isobutyl group, a t-butyl group, a pentyl group, a hexyl group, a cyclopropyl group, a cyclobutyl group, a cyclopentyl group, a cyclohexyl group, and the like.

The term "heteroalkyl group" may refer to an alkyl group that comprises at least one heteroatom, for example 1 to 3 heteroatoms, covalently bonded to one or more carbon atoms of the alkyl group. Each heteroatom is independently chosen from nitrogen (N), oxygen (O), sulfur (S), and phosphorus (P).

The term "aryl group" may refer to a substituent including all elements of the cycle having p-orbitals which form conjugation. The "aryl group" may refer to a monocyclic or fused ring polycyclic (i.e., rings sharing adjacent pairs of carbon atoms) substituent.

The term "heteroaryl group" may refer to an aryl group including carbon and 1 to 3 heteroatoms selected from the group consisting of N, O, S, and P as ring atoms. When the heteroaryl group is a fused ring, 1 to 3 heteroatoms may be present in each ring.

As used herein, when specific definition is not otherwise provided, the term "heterocyclic group" refers to a non-aromatic cyclic group including a heteroatom, for example a C1 to C7 cycloalkyl or cycloalkenyl group including a heteroatom in the ring, and a C1 to C6 cycloalkyl or cycloalkenyl group including two or more heteroatoms in the ring. Thus, as used herein, a heterocyclic group does not include a heteroaryl group.

The term "carbon cyclic group" may refer to a non-aromatic group that comprises one or more saturated and/or partially saturated rings in which all ring members are carbon, such as cyclopropyl, cyclobutyl, cyclopentyl, cyclohexyl, cycloheptyl, cyclooctyl, adamantyl, and partially saturated variants of the foregoing, such as cycloalkenyl groups (e.g., cyclohexenyl) or cycloalkynyl groups. Carbon cyclic groups do not include an aromatic ring or a heterocyclic ring. When the numbers of carbon atoms is specified (e.g., C3 to C15 carbon cyclic group), the number means the number of ring members present in the one or more rings.

The term "arylalkyl group" may refer to a substituted or unsubstituted aryl group covalently linked to an alkyl group that is linked to a compound (e.g., a benzyl is a C7 arylalkyl group).

The term "heteroarylalkyl group" may refer to a substituted or unsubstituted heteroaryl group covalently linked to an alkyl group that is linked to a compound.

The term "alkylaryl group" may refer to an alkyl group covalently linked to a substituted or unsubstituted aryl group that is linked to a compound.

The term "alkoxy group" may refer to an alkyl group that is linked via an oxygen (i.e., —O-alkyl). Non-limiting examples of alkoxy groups include methoxy groups, ethoxy groups, propoxy groups, isobutyloxy groups, sec-butyloxy groups, pentyloxy groups, iso-amyloxy groups, and hexyloxy groups.

The term "cycloalkyl group" may refer to a monovalent group having one or more saturated rings in which all ring members are carbon (e.g., cyclopentyl and cyclohexyl).

The term "alkenyl group" may refer to a straight or branched chain, monovalent hydrocarbon group having at least one carbon-carbon double bond (e.g., ethenyl (—HC═CH$_2$)). The term "alkynyl group" may refer to a straight or branched chain, monovalent hydrocarbon group having at least one carbon-carbon triple bond (e.g., ethynyl).

The term "amino group" may refer to a group of the formula —N(R)$_2$, wherein each R is independently hydrogen, a substituted or unsubstituted C1-C30 alkyl, or a substituted or unsubstituted C6-C30 aryl.

The term "trialkylsilyl group" may refer to a group of the formula —SiR$_3$, wherein each R is independently a substituted or unsubstituted C1 to C30 alkyl group.

The term "dialkylarylsilyl group" may refer to a group of the formula —Si(R$_1$)$_2$(R$_2$), wherein each R$_1$ is independently a substituted or unsubstituted C1 to C30 alkyl group and R$_2$ is a substituted or unsubstituted C6 to C30 aryl group.

The term "triarylsilyl group" may refer to a group of the formula —SiR$_3$, wherein each R is independently a substituted or unsubstituted C6 to C30 aryl group.

The term "diaryl boronyl group" may refer to a group of the formula —BR$_2$, wherein each R is independently a substituted or unsubstituted C6 to C30 aryl group.

The term "cyclometalating ligand" may refer to a ligand that has one nitrogen donor atom and one carbanion available to bind to a metal.

As used herein "CyN-M-CyC" may refer to a group consisting of CyN, M, and CyC wherein CyN-M-CyC forms a heterocyclic ring and CyN—CyC is a cyclometalating ligand bonded with M through a nitrogen atom and a carbon atom.

As used herein "CyN—CyC" may refer to a group consisting of CyN and CyC wherein CyN is fused with or bonded with CyC through a covalent bond via an atom of CyN and an atom of CyC.

According to an embodiment, an organometallic complex represented by the following Chemical Formula 1 is provided.

Chemical Formula 1

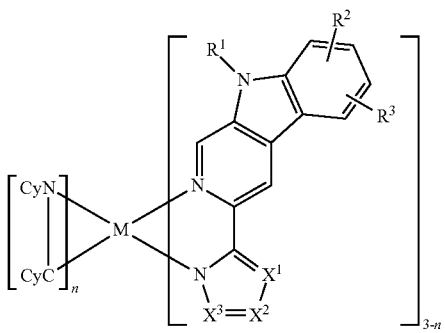

In Chemical Formula 1, M is Ir, Os, Pt, Pb, Re, Ru, or Pd, CyN-M-CyC forms a heterocyclic ring and CyN—CyC is a cyclometalating ligand bonded with M through a nitrogen atom and a carbon atom; or CyN is a substituted or unsubstituted C2 to C60 heterocyclic group including a nitrogen atom ((N), herein after "nitrogen" or) bonded with M or a substituted or unsubstituted C3 to C60 heteroaryl group including nitrogen bonded with M, CyC is a substituted or unsubstituted C4 to C60 carbon cyclic group including a carbon atom ((C), hereinafter "carbon") bonded with M, a substituted or unsubstituted C3 to C60 heterocyclic group including carbon bonded with M, a substituted or unsubstituted C3 to C60 aryl group including carbon bonded with M, a substituted or unsubstituted C7 to C60 arylalkyl group including a carbon atom bonded with M, or a substituted or unsubstituted C3 to C60 heteroaryl group including carbon bonded with M, and CyN—CyC is a cyclometalating ligand bonded with M through nitrogen (N) and carbon (C), X$^1$ to X$^3$ are independently N or CR', provided at least one of X$^1$ to X$^3$ is N, R$^1$ to R$^3$ and R' are independently hydrogen, deuterium, a halogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C2 to C30 alkenyl group, a substituted or unsubstituted C6 to C30 aryl group, a substituted or unsubstituted C1 to C30 heteroaryl group, a substituted or unsubstituted C1 to C30 amino group, SF$_5$, a trialkylsilyl group having a substituted or unsubstituted C1 to C30 alkyl group, a dialkylarylsilyl group having a substituted or unsubstituted C1 to C30 alkyl group and a C6 to C30 aryl group, a triarylsilyl group having a substituted or unsubstituted C6 to C30 aryl group, a substituted or unsubstituted diaryl boronyl, or at least two of R$^1$ to R$^3$ are fused to form a fused ring, and n is an integer ranging from 0 to 2.

According to an embodiment, an organometallic complex represented by Chemical Formula 1, which includes a novel auxiliary ligand, is provided.

The organometallic complex may sufficiently emit RGB (red, green, and blue) light from a triplet MLCT (metal to ligand charge transfer). The organometallic complex is a thermally stable and highly efficient phosphorescent material emitting light in a region ranging from about 400 to about 700 nm, and thus may provide RGB light or white light in an OLED (organic light-emitting diode) and the like.

In the organometallic complex represented by the above Chemical Formula 1, the M is a central metal combining a cyclometalating ligand and/or an auxiliary ligand and may include, for example, Ir, Os, Pt, Pb, Re, Ru, or Pd, and specifically Ir or Pt, but the present disclosure is not limited thereto.

The CyN in the above Chemical Formula 1 denotes a heterocyclic group or a heteroaryl group including a nitrogen atom directly forming a coordination bond with the M as a central metal. The heterocyclic group includes a C3 to C60 substituted or unsubstituted heterocyclic group including a heteroatom such as N, O, S, and/or P as a ring element forming a cycle, and for example, pyrrolidine, morpholine, thiomorpholine, thiazolidine, and the like, but the present disclosure is not limited thereto.

The heteroaryl group includes a C3 to C60 substituted or unsubstituted heteroaryl group including a heteroatom such as N, O, S, and/or P as a ring element forming a cycle, for example, pyridine, 4-methoxy pyridine, quinoline, pyrrole, indole, pyrazine, pyrazole, imidazole, pyrimidine, quinazoline, thiazole, oxazole, triazine, 1,2,4-triazole, and the like, but the present disclosure is not limited thereto.

In CyC of the above Chemical Formula 1, examples of the substituted or unsubstituted C4 to C60 carbon cyclic group including carbon bonded with M may be cyclohexane, cyclopentane, and the like, examples of the substituted or unsubstituted C3 to C60 heterocyclic group including carbon bonded with M may be tetrahydrofuran, 1,3-dioxane, 1,3-dithiane, 1,3-dithiolane, 1,4-dioxa-8-azaspiro[4,5]decane, 1,4-dioxaspiro[4,5]decan-2-one, and the like, examples of the substituted or unsubstituted C3 to 60 aryl group including carbon bonded with M may be phenyl, 1,3-benzodioxole, biphenyl, terphenyl, naphthalene, anthracene, azulene, and the like, examples of the substituted or unsubstituted C3 to C60 heteroaryl group including carbon bonded with M may be thiophene, furan, 2,5H-furanone, pyridine, coumarin, imidazole, 2-phenylpyridine, 2-benzothiazole, 2-benzooxazole, 1-phenylpyrazole, 1-naphthylpyrazole, 5-(4-methoxyphenyl)pyrazole, 2,5-bisphenyl-1, 3,4-oxadiazole, 2,3-benzofuran-2-(4-biphenyl)-6-phenyl benzooxazole, and the like. At least one hydrogen of the foregoing groups may be substituted with a C1 to C10 linear or branched alkoxy group, a cyano group, a halogen, and the like.

In Chemical Formula 1, each of the ring atoms of the CyN— and CyC groups respectively of CyN—CyC are connected to one another and form a substituted or unsubstituted 4 to 7 atom cyclic group or a substituted or unsubstituted 4 to 7 atom heterocyclic group, and specifically, a condensation 4 to 7 atom cyclic or heterocyclic group. Herein, the cyclic group or heterocyclic group may be a C4 to C30 cycloalkyl group, a C1 to C30 heterocycloalkyl group, a C6 to C30 aryl group, or a C4 to C30 heteroaryl group, wherein each cyclic group or heterocyclic group may be substituted by one or more than one substituent. Herein, "hetero" denotes substitution of a heteroatom such as N, O, P, S, and the like.

In the compound of the above Chemical Formula 1, at least one hydrogen may be substituted with various substituents such as a halogen, —OR¹, —N(R¹)₂, —P(R¹)₂, —POR¹, —PO₂R¹, —PO₃R¹, —SR¹, —Si(R¹)₃, —B(R¹)₂, —B(R¹)₂, —B(OR¹)₂, —C(O)R¹, —C(O)OR¹, —C(O)N (R¹), —CN, —NO₂, —SO₂, —SOR¹, —SO₂R¹, and —SO₃R¹, wherein R¹ is selected from hydrogen, a halogen, a substituted or unsubstituted C1 to C20 alkyl group, a substituted or unsubstituted C1 to C10 alkoxy group, a substituted or unsubstituted C2 to C20 alkenyl group, a substituted or unsubstituted C2 to C20 alkynyl group, a substituted or unsubstituted C1 to C20 heteroalkyl group, a substituted or unsubstituted C6 to C40 aryl group, a substituted or unsubstituted C7 to C40 arylalkyl group, a substituted or unsubstituted C7 to C40 alkylaryl group, a substituted or unsubstituted C2 to C40 heteroaryl group, and a substituted or unsubstituted C3 to C40 heteroarylalkyl.

The cyclometalating ligand (CyN—CyC) may be one of the following chemical formulae, but is not limited thereto.

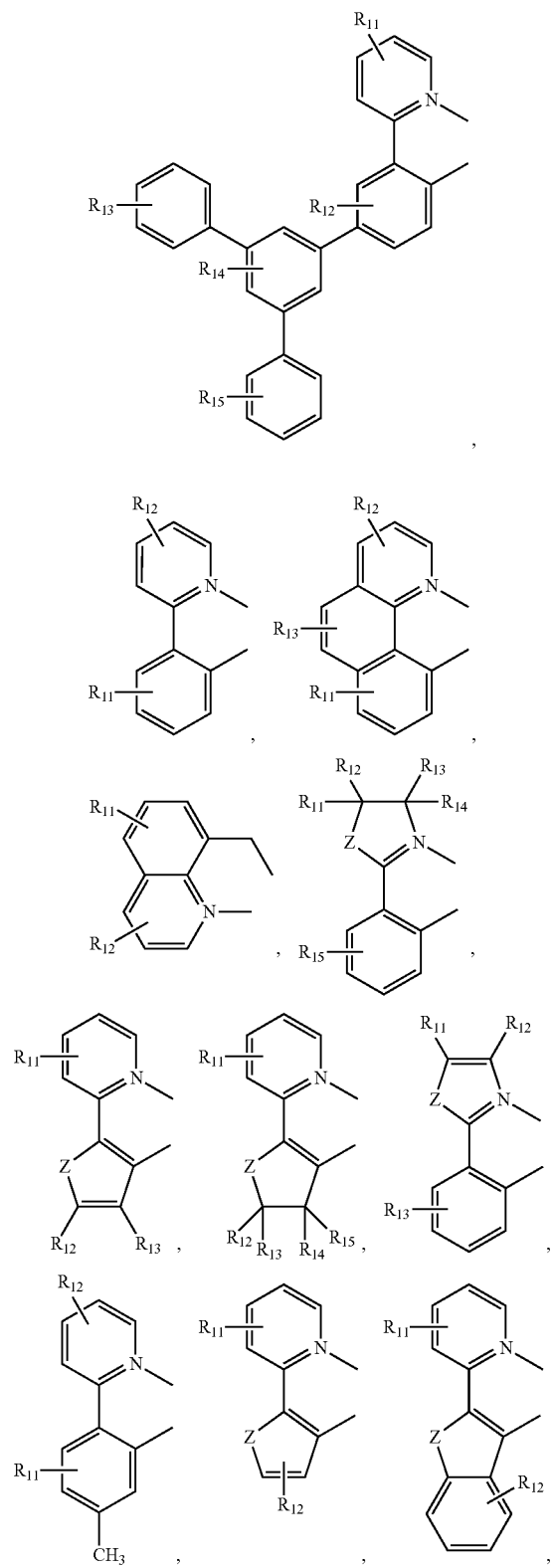

-continued
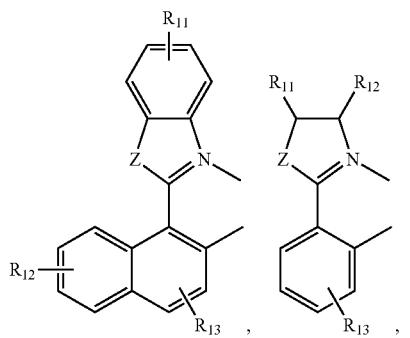
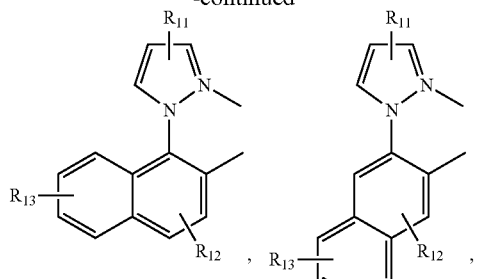
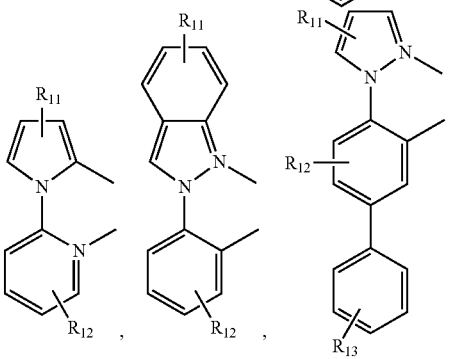
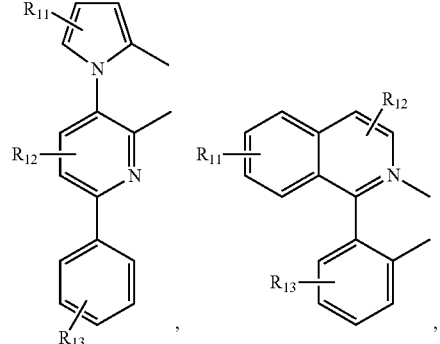
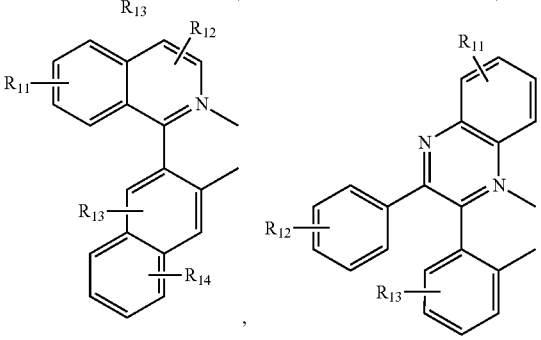
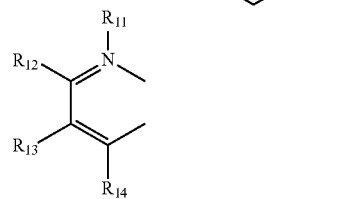
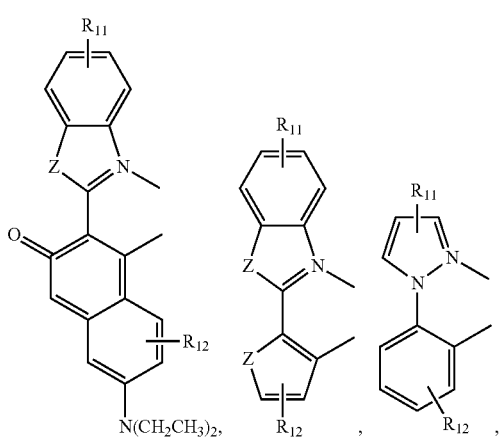
In the above chemical formulae, $R^{11}$, $R^{12}$, $R^{13}$, $R^{14}$, and $R^{15}$ are independently a monosubstituted or multisubstituted group, such as hydrogen, a halogen, —OR, —N(R)$_2$, —P(R)$_2$, —POR, —PO$_2$R, —PO$_3$R, —SR, —Si(R)$_3$, —B(R)$_2$, —B(OR)$_2$, —C(O)R, —C(O)OR, —C(O)N(R), —CN, —NO$_2$, —SO$_2$, —SOR, —SO$_2$R, —SO$_3$R, a C1 to C20 alkyl group, or a C6 to C20 aryl group, wherein R is hydrogen, deuterium, a halogen, a substituted or unsubstituted C1 to C20 alkyl group, a substituted or unsubstituted C1 to C10 alkoxy group, a substituted or unsubstituted C2 to C20 alkenyl group, a substituted or unsubstituted C2 to C20 alkynyl group, a substituted or unsubstituted C1 to C20 heteroalkyl group, a substituted or unsubstituted C6 to C40 aryl group, a substituted or unsubstituted C7 to C40 arylalkyl group, a substituted or unsubstituted C7 to C40 alkylaryl group, a substituted or unsubstituted C2 to C40 heteroaryl group, or a substituted or unsubstituted C3 to C40 heteroarylalkyl group, and Z is S, O, or $NR^o$, wherein $R^o$ is hydrogen or a C1 to C20 alkyl group.

The organometallic complex may be represented by the following Chemical Formula 2.

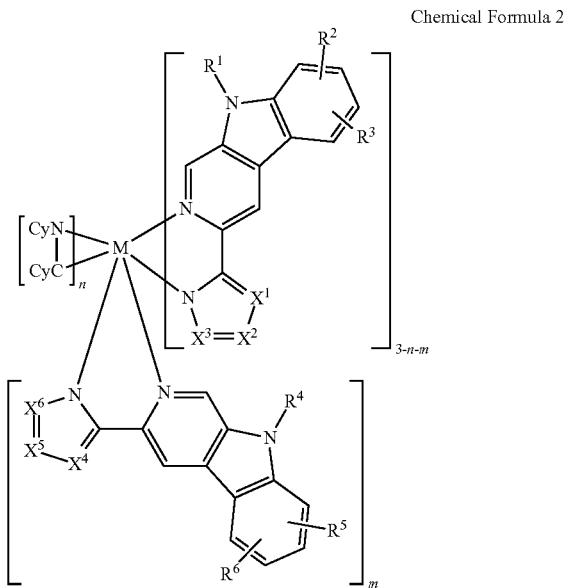

Chemical Formula 2

In Chemical Formula 2, M is Ir, Os, Pt, Pb, Re, Ru, or Pd, CyN-M-CyC forms a heterocyclic ring and CyN—CyC is a cyclometalating ligand bonded with M through a nitrogen atom and a carbon atom; or CyN is a substituted or unsubstituted C2 to C60 heterocyclic group including nitrogen bonded with M or a substituted or unsubstituted C3 to C60 heteroaryl group including nitrogen bonded with M, CyC is a substituted or unsubstituted C4 to C60 carbon cyclic group including carbon bonded with M, a substituted or unsubstituted C3 to C60 heterocyclic group including carbon bonded with M, a substituted or unsubstituted C3 to C60 aryl group including carbon bonded with M, a substituted or unsubstituted C7 to C60 arylalkyl group including a carbon atom bonded with M, or a substituted or unsubstituted C3 to C60 heteroaryl group including carbon bonded with M, and CyN—CyC is a cyclometalating ligand bonded with M through nitrogen (N) and carbon (C), $X^1$ to $X^6$ are independently N or CR', provided at least one of $X^1$ to $X^3$ is N and at least one of $X^4$ to $X^6$ is N, $R^1$ to $R^6$ and R' are independently hydrogen, deuterium, a halogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C2 to C30 alkenyl group, a substituted or unsubstituted C6 to C30 aryl group, a substituted or unsubstituted C1 to C30 heteroaryl group, a substituted or unsubstituted C1 to C30 amino group, $SF_5$, a trialkylsilyl group having a substituted or unsubstituted C1 to C30 alkyl group, a dialkylarylsilyl group having a substituted or unsubstituted C1 to C30 alkyl group and C6 to C30 aryl group, a triarylsilyl group having a substituted or unsubstituted C6 to C30 aryl group, a substituted or unsubstituted diaryl boronyl, or at least two of $R^1$ to $R^6$ are fused to form a fused ring, n and m are independently integers ranging from 0 to 2, and m+n≤3.

The organometallic complex may be represented by the following Chemical Formula 3.

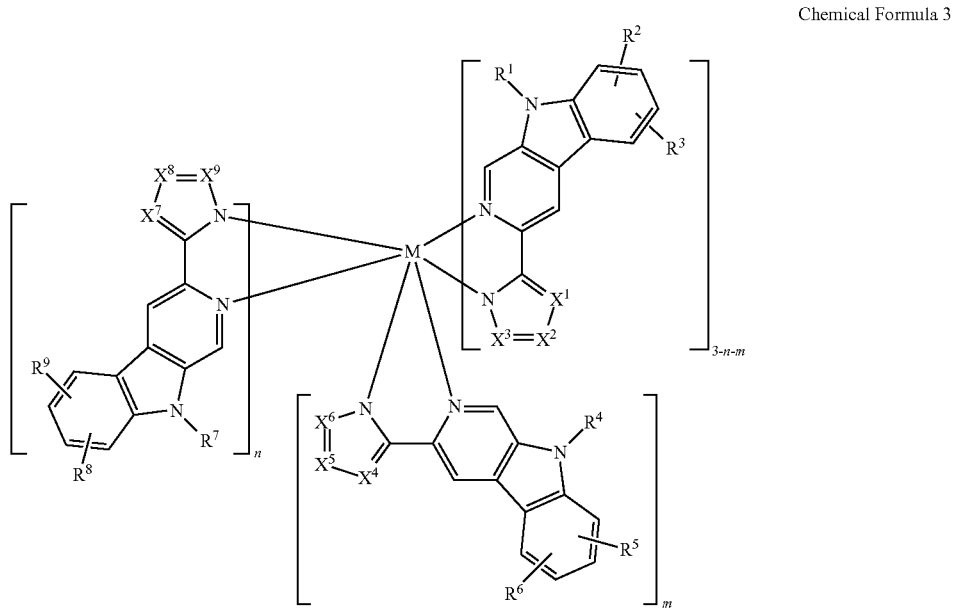

Chemical Formula 3

In Chemical Formula 3, M is Ir, Os, Pt, Pb, Re, Ru, or Pd, $X^1$ to $X^9$ are independently N or CR', provided at least one of $X^1$ to $X^3$ is N, at least one of $X^4$ to $X^6$ is N, and at least one of $X^7$ to $X^9$ is N, $R^1$ to $R^9$ and R' are independently hydrogen, deuterium, a halogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C2 to C30 alkenyl group, a substituted or unsubstituted C6 to C30 aryl group, a substituted or unsubstituted C1 to C30 heteroaryl group, a substituted or unsubstituted C1 to C30 amino group, $SF_5$, a trialkylsilyl group having a substituted or unsubstituted C1 to C30 alkyl group, a dialkylarylsilyl group having a substituted or unsubstituted C1 to C30 alkyl group and a C6 to C30 aryl group, a triarylsilyl group having a substituted or unsubstituted C6 to C30 aryl group, a substituted or unsubstituted diaryl boronyl, or $R^1$ to $R^9$ are fused to form a fused ring, n and m are independently integers ranging from 0 to 2, and m+n≤3.

At least two of $X^1$ to $X^3$ may be N. All of $X^1$ to $X^3$ may be N.

At least two of $X^1$ to $X^3$ may be N, and at least two of $X^4$ to $X^6$ may be N. All of $X^1$ to $X^3$ may be N, and all of $X^4$ to $X^6$ may be N.

At least two of $X^1$ to $X^3$ may be N, at least two of $X^4$ to $X^6$ may be N, and at least two of $X^7$ to $X^9$ may be N. All of $X^1$ to $X^3$ may be N, all of $X^4$ to $X^6$ may be N, and all of $X^7$ to $X^9$ may be N.

The number of nitrogens of $X^1$ to $X^9$ in the above Chemical Formulae 1 to 3 may be selected according to the desired purpose.

The compound represented by the above Chemical Formula 1 may be represented by one of the following Chemical Formulae A-1 to A-7, but is not limited thereto.

Chemical Formula A-1

Chemical Formula A-2

Chemical Formula A-3

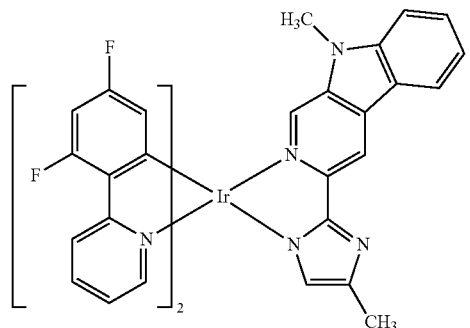

Chemical Formula A-4

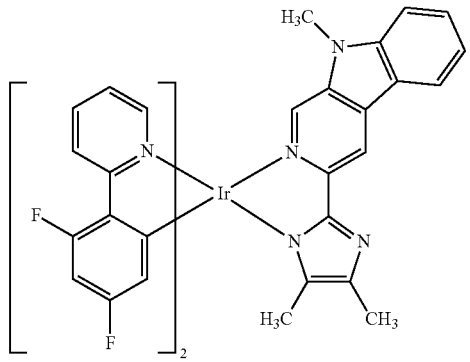

Chemical Formula A-5

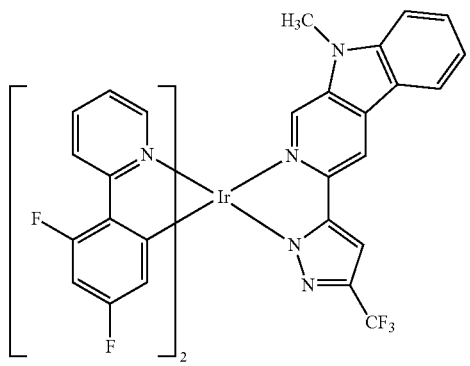

Chemical Formula A-6

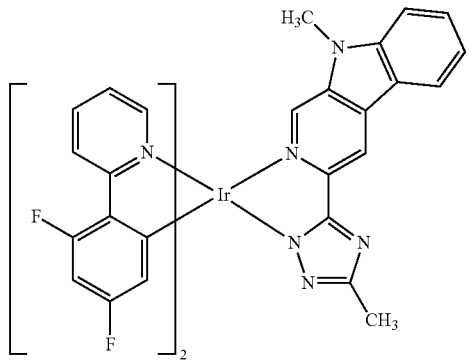

Chemical Formula A-7

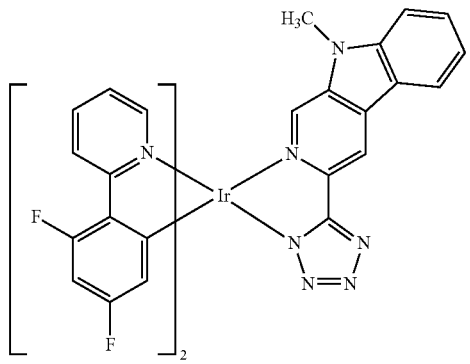

According to an embodiment, an organometallic complex represented by the above Chemical Formula 1 may be synthesized in a method using a cyclometalated ligands (C^N) in Ir(III) dimers derivative, [Ir(C^N)$_2$Cl]$_2$, as a starting material providing a cyclometalizing moiety, which is reported by the Watts group (F. O. Garces, R. J. Watts, Inorg. Chem. 1988, 27, 3464).

According to another embodiment, an organic electroluminescence device is fabricated by using an organometallic complex represented by the above Chemical Formula 1 to form an organic layer, and particularly an emission layer. Herein, the organometallic complex represented by the above Chemical Formula 1, when used as a component of an emission layer-forming material, is a phosphorescent dopant material and has an excellent light-emitting characteristic in an RGB region.

When the organometallic complex represented by the above Chemical Formula 1 is used as a phosphorescent dopant, an organic layer may further include at least one selected from a polymer host, a mixture host of a polymer and a low molecular host, a low molecular host, and a non-light-emitting polymer matrix. Herein, the polymer host, low molecular host, and non light-emitting polymer matrix may include a conventional material for forming an emission layer for an organic electroluminescence device. Examples of the polymer host may include PVK (poly(vinylcarbazole)), polyfluorene, and the like. Examples of the low molecular host may include CBP (4,4'-N,N'-dicarbazole-biphenyl), 4,4'-bis[9-(3,6-biphenylcarbazolyl)]-1-1,1'-biphenyl{4,4'-bis[9-(3,6-biphenylcarbazolyl)]-1-1,1'-biphenyl}, 9,10-bis[(2',7'-t-butyl)-9',9'''-spirobifluorenyl] anthracene, tetrafluorene, and the like. Examples of the non-light-emitting polymer matrix may include polymethylmethacrylate, polystyrene, and the like, but the present disclosure is not limited thereto.

The organometallic complex represented by the above Chemical Formula 1 may be included in an amount of about 1 to about 30 parts by weight, for example 1 to 25 parts by weight, 1 to 20 parts by weight, 10 to 30 parts by weight, based on 100 parts by weight of the organic layer, for example, an emission layer-forming material. Without wishing to be bound by theory, when the organometallic complex is included in an amount of less than about 1 part by weight, a light emitting material is insufficient and deteriorates efficiency and life-span, while when the organometallic complex is included in an amount of greater than about 30 parts by weight, a triplet is quenched and efficiency is deteriorated. This organometallic complex may be introduced into an emission layer in a method such as vacuum deposition, sputtering, printing, coating, inkjet printing, and the like.

In addition, the organometallic complex represented by the above Chemical Formula 1 may realize various colors depending on combination of a cyclometalized ligand and an auxiliary ligand. This organometallic complex may be used with other color light-emitting materials to thus emit white light.

FIG. 1A to 1F schematically show the lamination structure of an organic electroluminescence device according to one embodiment of the present disclosure.

Referring to FIG. 1A, an emission layer 12 including an organometallic complex represented by the above Chemical Formula 1 is disposed on a first electrode 10, and a second electrode 14 is disposed on the emission layer 12.

Figure 1B:
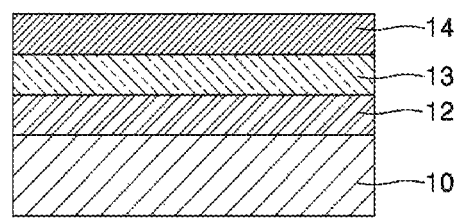

Referring to FIG. 1B, the emission layer 12 including an organometallic complex represented by the above Chemical Formula 1 is disposed on the first electrode 10, a hole blocking layer (HBL) 13 is disposed on the emission layer 12, and the second electrode 14 is disposed thereon.

Figure 1C:
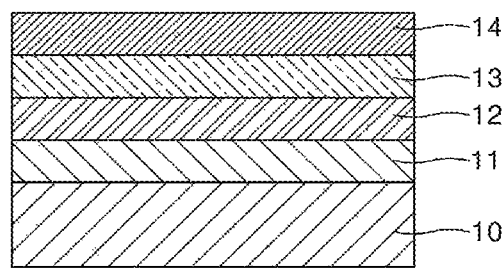

FIG. 1C shows an organic electroluminescence device including a hole injection layer (HIL) 11 between the first electrode 10 and the emission layer 12. a hole blocking layer (HBL) 13 is disposed on the emission layer 12, and the second electrode 14 is disposed thereon.

Figure 1D:
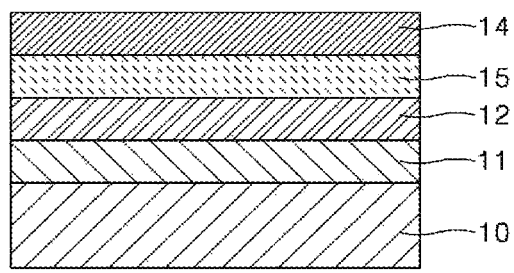

FIG. 1D shows an organic electroluminescence device having the same structure as the one of FIG. 1C, except for forming an electron transport layer (ETL) 15 instead of the hole blocking layer (HBL) 13 on the emission layer 12.

Figure 1E:
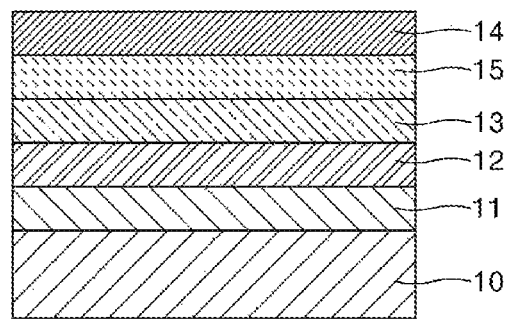

FIG. 1E shows an organic electroluminescence device having the same structure as the one of FIG. 1C, except for sequentially disposing the hole blocking layer (HBL) 13 and the electron transport layer (ETL) 15 instead of the hole blocking layer (HBL) 13 including an organometallic complex represented by Chemical Formula 1 on the emission layer 12. FIG. 1E shows an organic electroluminescence device further including an electron injection layer (EIL) (not shown) between the electron transport layer (ETL) 15 and the second electrode 14.

Figure 1F:
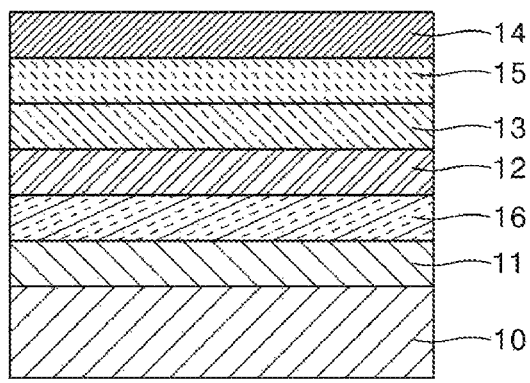
Figure 2:
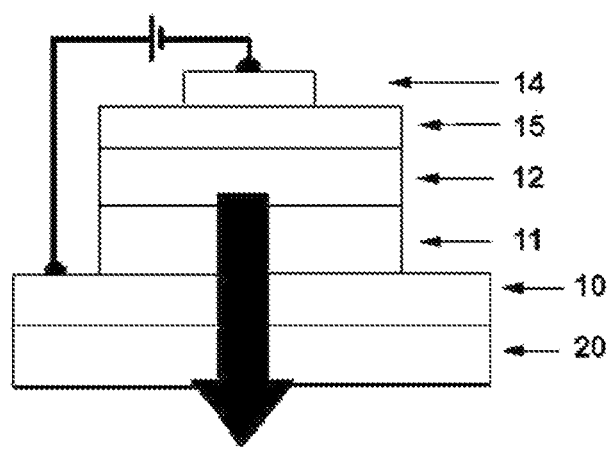
FIG. 2 shows an organic electroluminescence device according to an embodiment of the disclosure.

FIG. 1F shows an organic electroluminescence device having the same structure as the one of FIG. 1E, further including a hole transport layer (HTL) 16 between the hole injection layer (HIL) 11 and the emission layer 12. Herein, the hole transport layer (HTL) 16 plays a role of suppressing impurities from transmission from the hole injection layer (HIL) 11 into the emission layer 12.

The organic electroluminescence device may be fabricated in a conventional method, but is not limited thereto.

Herein, the organic layer may be about 30 to about 100 nm thick, for example 30 to 90 nm thick, 30 to 80 nm thick, 40 to 100 nm thick, or 40 to 100 nm thick. When the organic layer is less than about 30 nm thick, efficiency, and life-span may be deteriorated, and when the organic layer is greater than 100 nm thick, the driving voltage may be increased.

On the other hand, the organic layer may be a layer formed of an organic compound between a pair of electrodes in an organic electroluminescence device, for example, an electron transport layer (ETL), a hole transport layer (HTL), and the like, other than the emission layer.

On the other hand, a buffer layer may be formed among each layer in the organic electroluminescence device, and may be formed of a conventional material such as copper phthalocyanine, polythiophene, polyaniline, polyacetylene, polypyrrole, polyphenylenevinylene, or a derivative thereof, but the present disclosure is not limited thereto.

The hole transport layer (HTL) may be formed of a conventional material, for example polytriphenylamine, but the present disclosure is not limited thereto.

The electron transport layer (ETL) may be formed of a conventional material, for example polyoxadiazole, but the present disclosure is not limited thereto.

The hole blocking layer may be formed of a conventional material, for example, LiF, $BaF_2$, $MgF_2$, or the like, but the present disclosure is not limited thereto.

According to an embodiment of the present disclosure, the organic electroluminescence device may be fabricated using a common light emitting material without a particular device or method.

The organometallic complex represented by Chemical Formula 1 according to one embodiment of the present disclosure may emit light in a wavelength region ranging from about 400 to about 700 nm. When the organometallic complex is used to fabricate a light emitting diode, the light emitting diode may be used for a light source lamp for a full color display, a backlight, an outdoor bulletin board, optical communication, interior decoration, and the like.

The organometallic complex according to an embodiment of the present disclosure has excellent light emitting characteristics and may form a dopant having excellent phosphorescent characteristics. Specifically, the dopant may be used as a phosphorescent material emitting light in various chromophore regions due to a strong electronic effect depending on a substituent.

More specifically, the organometallic complex according to one embodiment of the present invention has excellent thermal stability. The thermal stability of the organometallic complex may excellently endure firing and the like during the fabrication of a device.

According to another embodiment of the present disclosure, a display device including the organic optoelectronic device is provided.

Hereinafter, the embodiments are illustrated in more detail with reference to examples. These examples, however, should not in any sense be interpreted as limiting the scope of the present disclosure.

Synthesis of Organometallic Complex

Example 1

Synthesis of Compound of Chemical Formula A-1

Synthesis of Ancillary Ligand

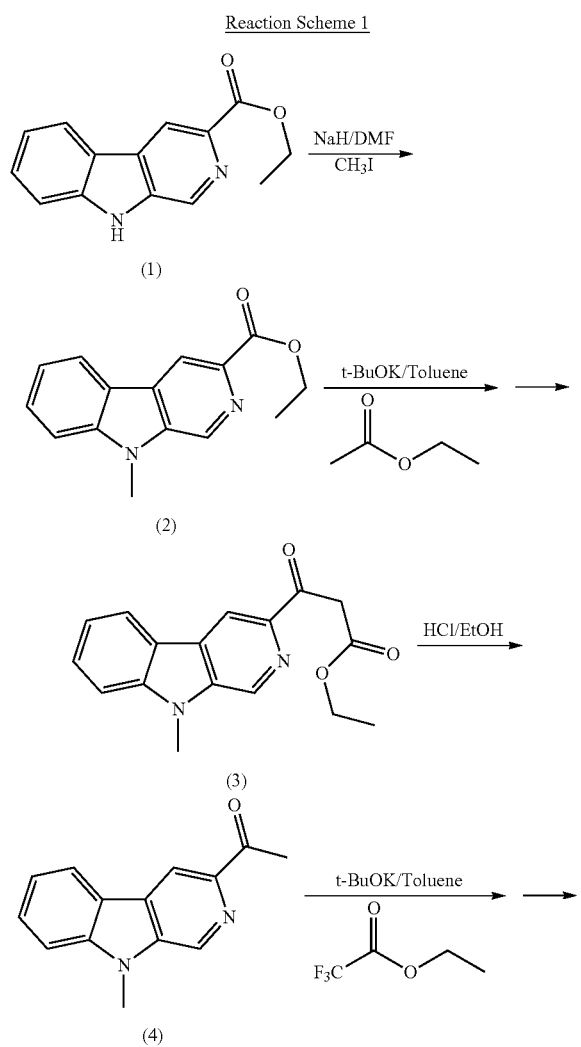

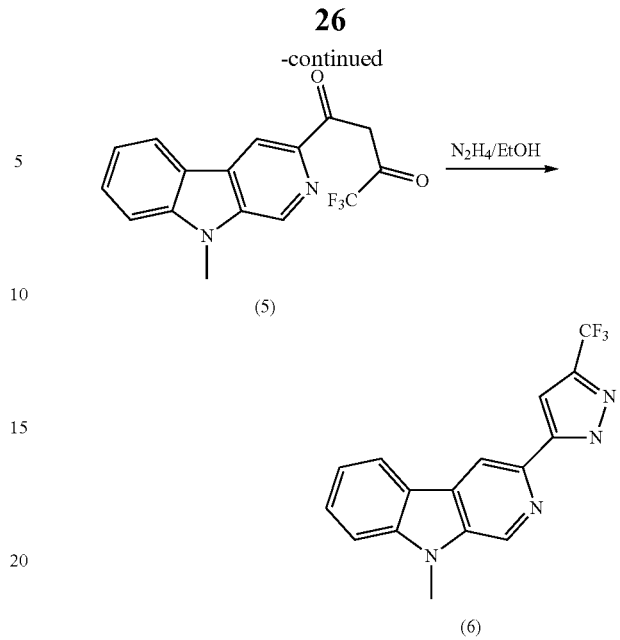

Synthesis of a compound (2): 0.8 g (0.02 mol) of NaH is added to 4 g (0.0167 mol) of a compound (1) in 20 ml of dry DMF in air. The reactant is agitated for 1 hour, and 1 hour later, the reaction is quenched with water. The reaction mixture is extracted with ethyl acetate. Then, an organic layer is separated, washed with water, and dried with $MgSO_4$. Next, the crude product is purified through silica gel chromatography. Ethyl acetate is then removed therefrom under a vacuum condition.

Yield: 3.6 g (85%)

Synthesis of a compound (3): 4.25 g (0.0167 mol) of the compound (2), along with 2.82 g (0.0251 mol, 1.5 excess) of potassium t-butoxide, is added to a mixture of 80 ml of dry toluene and 8 ml of ethyl acetate. The reactant is mixed for 15 hours, 150 ml of water is added thereto, and the resulting mixture is cooled. The cooled reaction mixture is extracted with ethyl acetate, and an organic layer is separated therefrom, dried with $MgSO_4$, and concentrated under a vacuum condition, obtaining a compound (3).

Yield: 3.8 g (77%)

Synthesis of a compound (4): 3.8 g (0.0128 mol) of the compound (3) is dissolved in 30 ml of ethanol and 30 ml of concentrated HCl. The solution is agitated for 5 hours. When the reaction is complete, the mixture is neutralized with a 20% NaOH aqueous solution. Then, a white precipitate therein is separated and washed with distilled water. The washed product is dried for one night under a vacuum condition.

Yield: 2.3 g (80%)

Synthesis of a compound (5): 2.3 g (0.0103 mol) of the compound (4) is put in 40 ml of toluene, and 4.6 g (0.032 mol) of ethyl trifluoroacetate and 2.4 g (0.021 mol) of potassium t-butoxide are added thereto. The reaction mixture is agitated for one night. The toluene is evaporated, and then a remaining solid is washed with water and chloroform and dried under vacuum.

Yield: 2.2 g (67%)

Synthesis of a compound (6): 2.2 g (0.0069 mol) of the compound (5) is put in 80 ml of ethanol, 3.8 g (40%) of a hydrazine solution (7 eq) is added thereto, and then 1 ml of acetic acid is added thereto. The mixture is agitated at room temperature for one night. When the reaction is complete, the ethanol is removed under vacuum, and a remaining product is washed three times with water and dried in an oven, obtaining a compound (6).

Yield: 1.8 g (82%)

Figure 3:
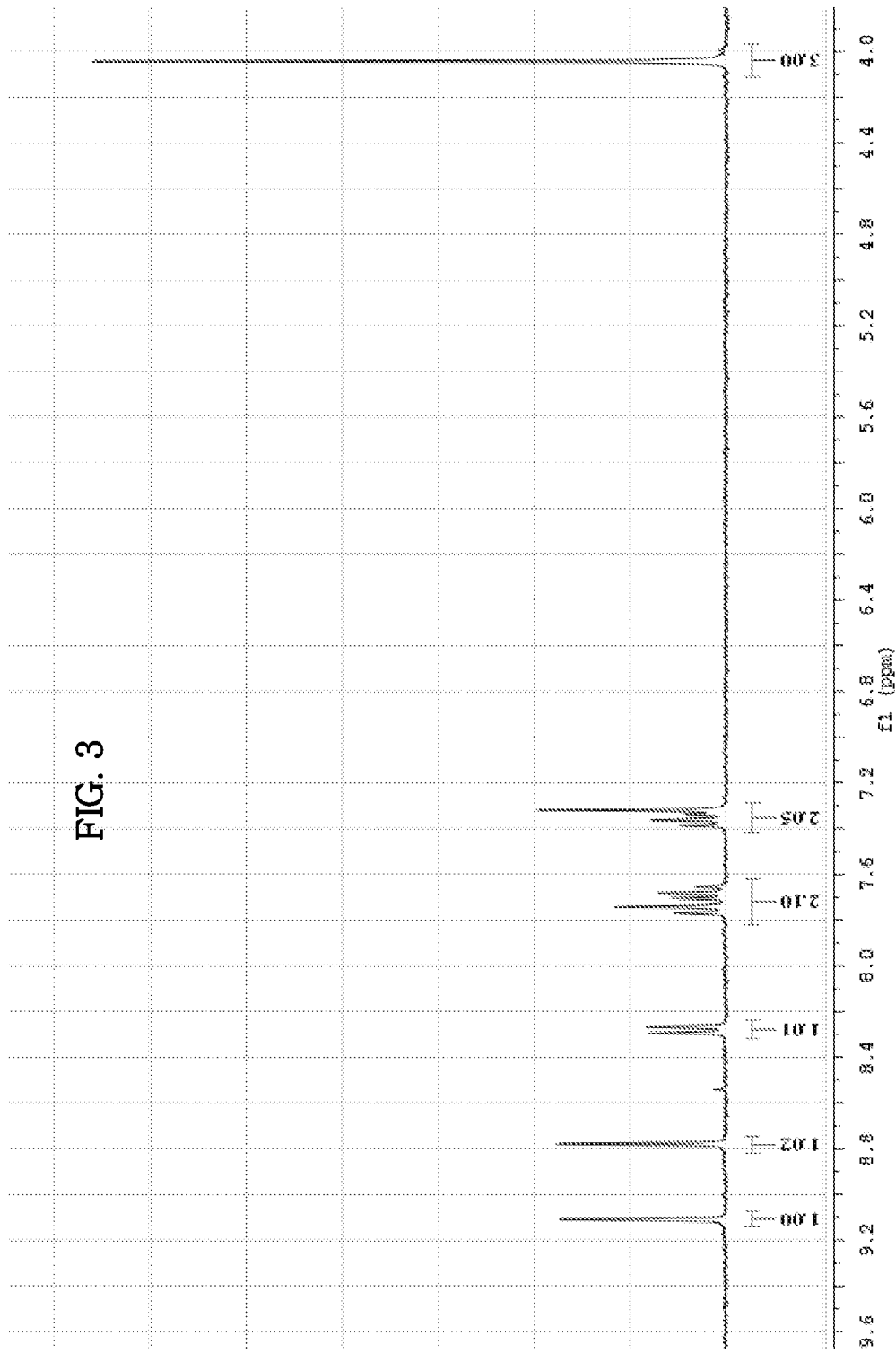
FIG. 3 shows $^1$H NMR (DMSO) of the compound 6.

FIG. 3 shows $^1$H NMR (DMSO) of the compound (6). Accordingly, the $^1$H NMR (DMSO) confirms that the obtained compound is a desired compound.

Synthesis of Compound of Chemical Formula A-1

Examples 2 to 7

Synthesis of Compound of Chemical Formulae A-2 to A-7

The compounds represented by the above Chemical Formulae A-2 to A-7 are synthesized according to a similar method to that of Example 1.

Reaction Scheme 2

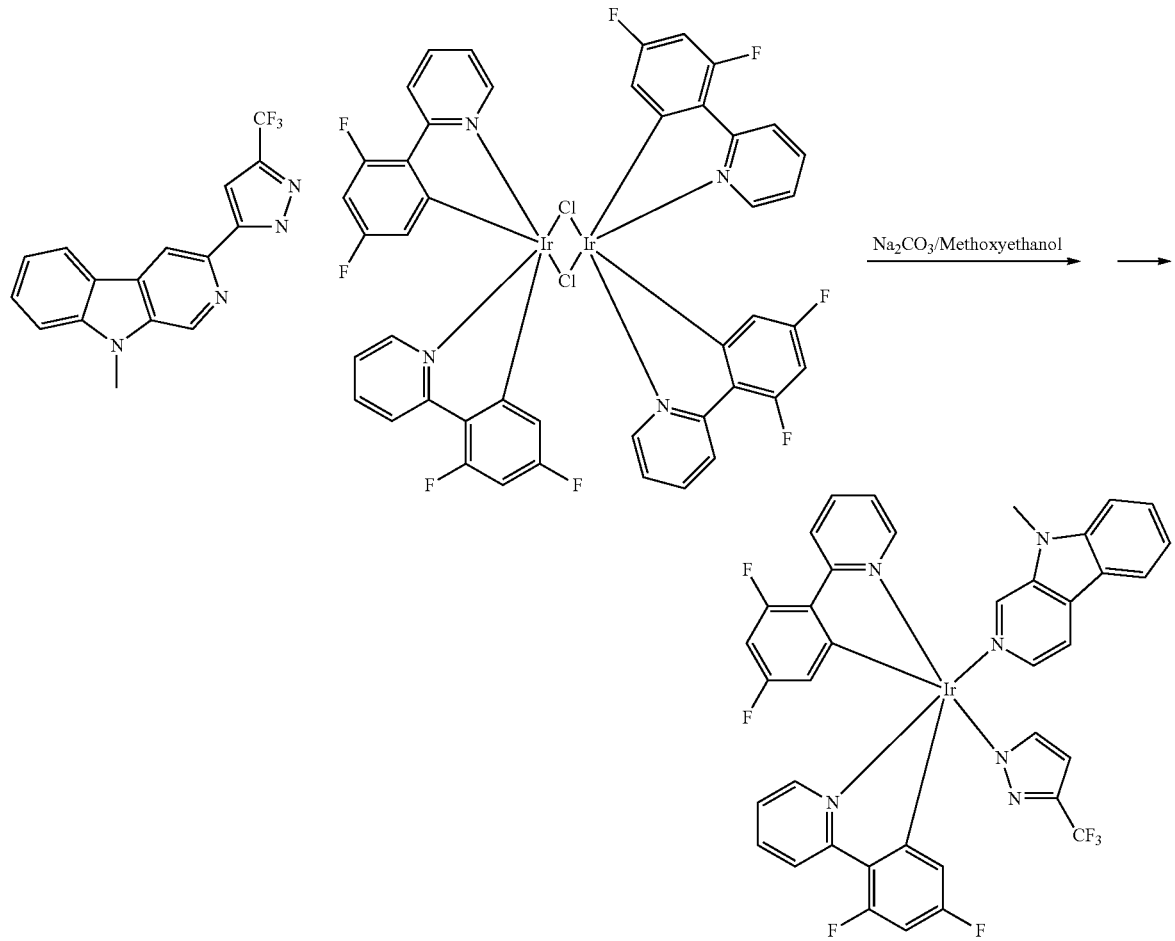

0.9728 g (0.0008 mol) of an iridium chloro-bridge dimer composite, 0.616 g (0.002 mol) of carbonylpyrazole, and 900 mg of sodium carbonate anhydride are agitated in 90 ml of methoxyethanol for 2 days. When the reaction is complete, a product therein is separated, washed with a small amount of methoxyethanol and water, and dried under vacuum.

Yield: 1.2 g (85%)

Figure 4:
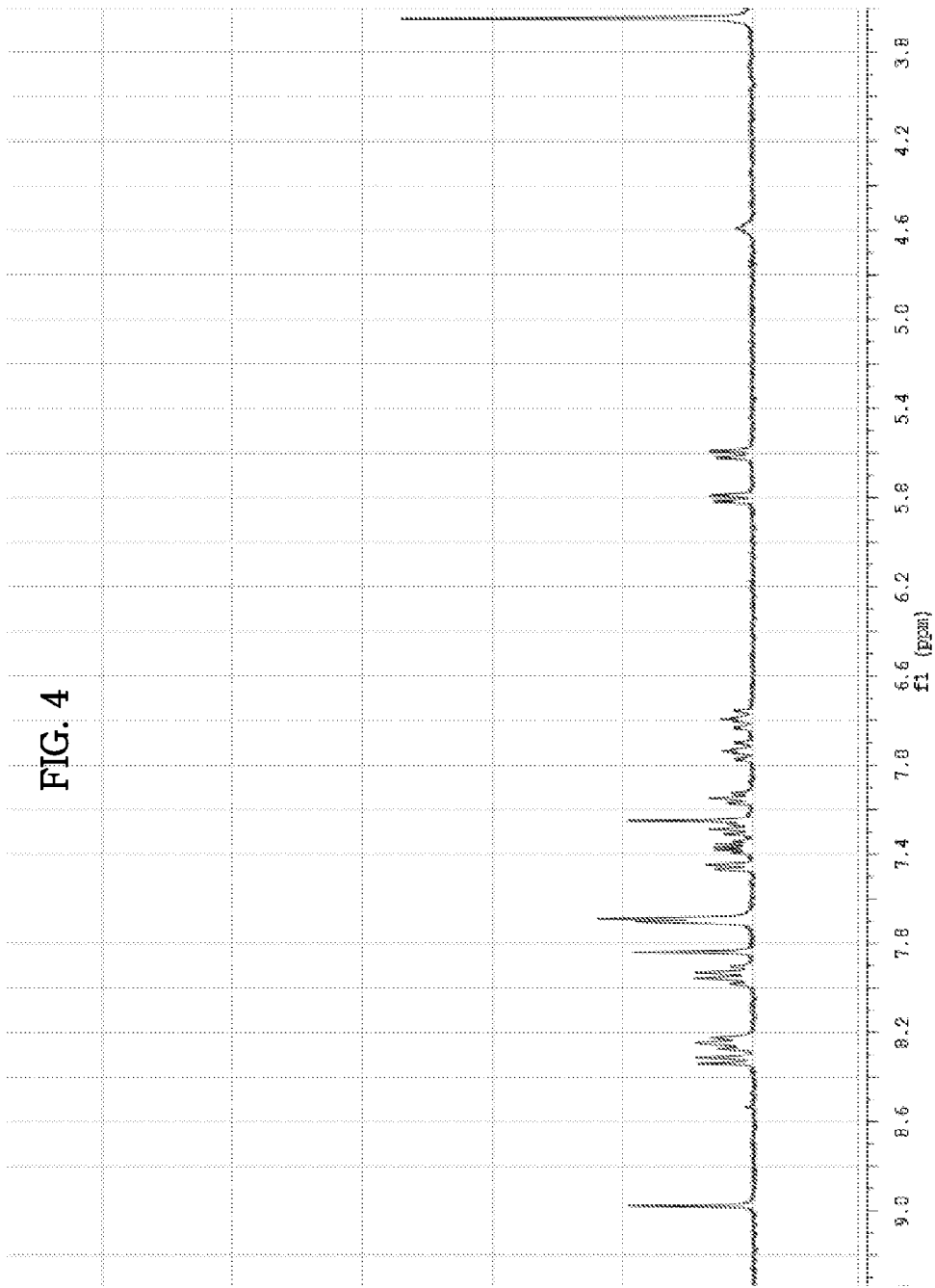
FIG. 4 shows $^1$H NMR (DMSO) of the compound represented by Chemical Formula A-1.

FIG. 4 shows 1H NMR (DMSO) of the compound represented by Chemical Formula A-1.

Based on the 1H NMR and mass analysis, the compound has a structure represented by the above Chemical Formula A-1. In addition, the complex has a decomposition temperature of greater than or equal to 400° C. found through thermogravimetric analysis. The complex dissolved in 2-methyltetrahydrofuran has CIE color coordinates of 0.16 and 0.25, and emits light at 465 nm.

Fabrication of Organic Electroluminescence Device

Examples 8 to 14

Fabrication of Organic Electroluminescence Device

A transparent electrode substrate coated with ITO (indium-tin oxide) is cleaned, and the ITO is patterned with a photosensitive resin and an etchant to form an ITO pattern. Then, the ITO-patterned transparent electrode substrate is cleaned again. The ITO glass substrate is sonicated in isopropyl alcohol (IPA), cleaned, and rinsed with deionized water. The rinsed ITO glass substrate is UV-ozone treated before it is used to fabricate an ITO coated glass substrate device.

On the other hand, an HTL, an EML, and an ETL are thermally deposited under a thermal vacuum condition of $10^{-7}$ torr. Then, a LiF electrode and an aluminum cathode are formed under a vacuum condition. As for each layer of a phosphorescence device, the electron-transporting material is 1,3,5-tri[(3-pyridyl)-phen-3-yl]benzene (TmPyPB), the hole-transporting material is 1,1-bis{4-[N,N'-di(p-tolyl)amino]phenyl]cyclohexane (TAPC), and a host material for an emission layer is 2,6-bis[3-(9H-carbazol-9-yl)phenyl]pyridine (26DCzPPy). The emission layer is a phosphorescent emission layer formed by doping each compound represented by Chemical Formulae A-1 to A-7 at a concentration of 6%. The compound has a structure as follows.

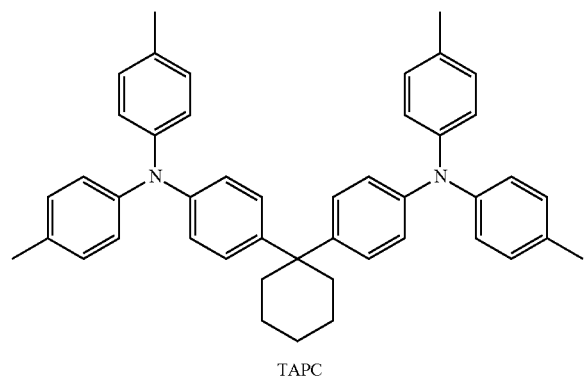

TAPC

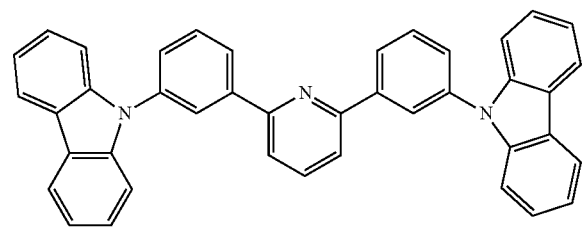

26DCzPPy

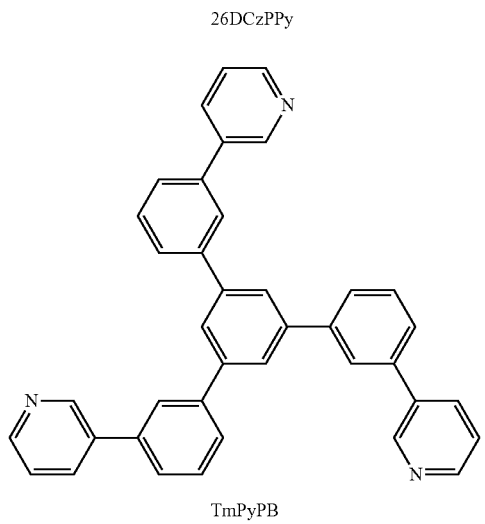

TmPyPB

Experimental Example

Compound Characteristic Evaluation

The compounds represented by the above Chemical Formulae A-1 to A-7 are measured regarding HOMO, LUMO, and light emitting wavelength from solutions prepared by dissolving the compounds in 2-methyltetrahydrofuran, and the results are provided in the following Table 1. Herein, the HOMO is measured through cyclic voltammetry, and the LUMO is measured through UV-visible spectroscopy.

TABLE 1

| Compound | Isomer | HOMO (eV) | LUMO (eV) | Gap (eV) | T1 (eV) | T1 (nm) |
|---|---|---|---|---|---|---|
| A-1 | fac | 4.737 | 1.628 | 3.109 | 2.2622 | 548.07 |
| A-2 | fac | 5.166 | 1.767 | 3.399 | 2.4590 | 504.21 |
| A-3 | fac | 4.597 | 1.611 | 2.986 | 2.1810 | 568.48 |
| A-4 | fac | 4.433 | 1.637 | 2.796 | 2.0740 | 597.80 |
| A-5 | fac | 5.652 | 1.735 | 3.917 | 2.7843 | 445.30 |
| A-6 | fac | 5.118 | 1.676 | 3.442 | 2.4790 | 500.14 |
| A-7 | fac | 5.650 | 1.882 | 3.768 | 2.7331 | 453.64 |

Device Characteristic Evaluation

The devices according to Examples 8 to 14 are evaluated regarding characteristics. The evaluation is performed in the following method.

The devices are measured regarding density-voltage (J-V) current and luminance-voltage (L-V) characteristic using a Keithley 2635A meter and a Minolta CS-100A luminance meter. In addition, the EL (electroluminescence) spectrum and CIE color coordinator of the devices are measured using a Minolta CS-1000A meter.

The EL devices have the following characteristics.

TABLE 2

| | EL λmax (nm) | CIE (x, y) at 10 mA | Maximum efficiency ηL (cd/A) | Driving voltage (V) |
|---|---|---|---|---|
| Example 8 | 525 | 0.32, 0.61 | 32.5 | 4.3 |
| Example 9 | 510 | 0.28, 0.58 | 15.8 | 4.3 |
| Example 10 | 570 | 0.37, 0.55 | 42 | 4.1 |
| Example 11 | 599 | 0.55, 0.41 | 55 | 4.2 |
| Example 12 | 453 | 0.16, 0.27 | 11 | 5.1 |
| Example 13 | 500 | 0.29, 0.51 | 15.8 | 4.3 |
| Example 14 | 454 | 0.17, 0.28 | 12 | 5.2 |

Referring to Table 2, an electroluminescence device using a compound according to the present disclosure has high luminance and high efficiency, and may be operated at a low voltage.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not to limit the present invention in any way.

What is claimed is:

1. An organometallic complex represented by Chemical Formula 1:

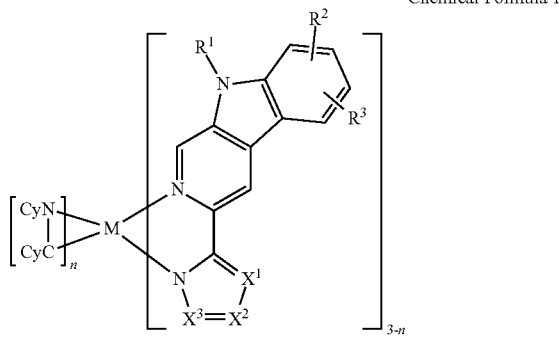

Chemical Formula 1 wherein, in Chemical Formula 1,

M is Ir, Os, Pt, Pb, Re, Ru, or Pd,

CyN-M-CyC forms a heterocyclic ring and CyN—CyC is a cyclometalating ligand bonded with M through a nitrogen atom and a carbon atom; or CyN is a substituted or unsubstituted C2 to C60 heterocyclic group comprising a nitrogen atom bonded with M or a substituted or unsubstituted C3 to C60 heteroaryl group including a nitrogen atom bonded with M, CyC is a substituted or unsubstituted C4 to C60 carbon cyclic group including a carbon atom bonded with M, a substituted or unsubstituted C3 to C60 heterocyclic group including a carbon atom bonded with M, a substituted or unsubstituted C6 to C60 aryl group including a carbon atom bonded with M, a substituted or unsubstituted C7 to C60 arylalkyl group including a carbon atom bonded with M, or a substituted or unsubstituted C3 to C60 heteroaryl group including a carbon atom bonded with M, and CyN—CyC is a cyclometalating ligand bonded with M through a nitrogen atom and a carbon atom, $X^1$ to $X^3$ are independently N or CR', provided at least one of $X^1$ to $X^3$ is a nitrogen atom, $R^1$ to $R^3$ and R' are independently hydrogen, deuterium, a halogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C2 to C30 alkenyl group, a substituted or unsubstituted C6 to C30 aryl group, a substituted or unsubstituted C1 to C30 heteroaryl group, a substituted or unsubstituted C1 to C30 amino group, $SF_5$, a trialkylsilyl group having a substituted or unsubstituted C1 to C30 alkyl group, a dialkylarylsilyl group having a substituted or unsubstituted C1 to C30 alkyl group and a C6 to C30 aryl group, a triarylsilyl group having a substituted or unsubstituted C6 to C30 aryl group, a substituted or unsubstituted diaryl boronyl, or at least two of $R^1$ to $R^3$ are fused to form a fused ring, and n is an integer ranging from 0 to 2.

2. The organometallic complex of claim 1, wherein the organometallic complex is represented by Chemical Formula 2:

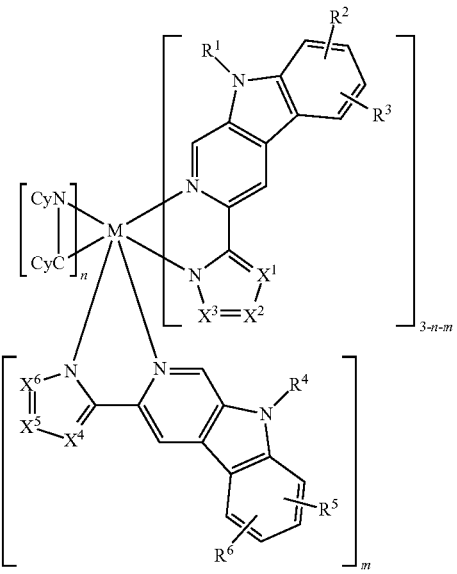

Chemical Formula 2 wherein, in Chemical Formula 2,

M is Ir, Os, Pt, Pb, Re, Ru, or Pd,

CyN-M-CyC forms a heterocyclic ring and CyN—CyC is a cyclometalating ligand bonded with M through a nitrogen atom and a carbon atom; or CyN is a substituted or unsubstituted C2 to C60 heterocyclic group comprising a nitrogen atom bonded with M or a substituted or unsubstituted C3 to C60 heteroaryl group comprising a nitrogen atom bonded with M, CyC is a substituted or unsubstituted C4 to C60 carbon cyclic group including a carbon atom bonded with M, a substituted or unsubstituted C3 to C60 heterocyclic group including a carbon atom bonded with M, a substituted or unsubstituted C6 to C60 aryl group including a carbon atom bonded with M, a substituted or unsubstituted C7 to C60 arylalkyl group including a carbon atom bonded with M, or a substituted or unsubstituted C3 to C60 heteroaryl group including a carbon atom bonded with M, and CyN—CyC is a cyclometalating ligand bonded with M through a nitrogen atom and a carbon atom, $X^1$ to $X^6$ are independently N or CR', provided at least one of $X^1$ to $X^3$ is a nitrogen atom and at least one of $X^4$ to $X^6$ is a nitrogen atom, $R^1$ to $R^6$ and R' are independently hydrogen, deuterium, a halogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C2 to C30 alkenyl group, a substituted or unsubstituted C6 to C30 aryl group, a substituted or unsubstituted C1 to C30 heteroaryl group, a substituted or unsubstituted C1 to C30 amino group, $SF_5$, a trialkylsilyl group having a substituted or unsubstituted C1 to C30 alkyl group, a dialkylarylsilyl group having a substituted or unsubstituted C1 to C30 alkyl group and a C6 to C30 aryl group, a triarylsilyl group having a substituted or unsubstituted C6 to C30 aryl group, a substituted or unsubstituted diaryl boronyl, or at least two of $R^1$ to $R^6$ are fused to form a fused ring, n and m are independently integers ranging from 0 to 2, and m+n≤3.

3. The organometallic complex of claim 1, wherein the organometallic complex is represented by Chemical Formula 3:

Chemical Formula 3

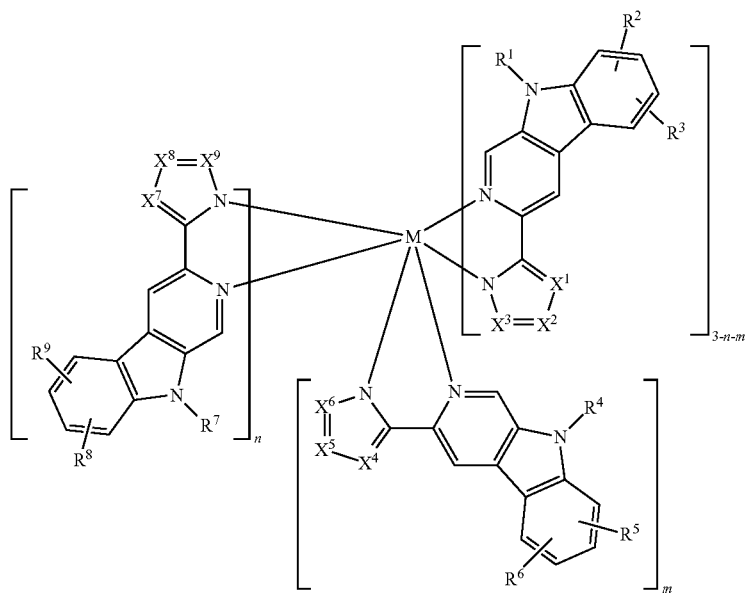

wherein, in Chemical Formula 3,

M is Ir, Os, Pt, Pb, Re, Ru, or Pd, $X^1$ to $X^9$ are independently N or CR', provided at least one of $X^1$ to $X^3$ is atom N, at least one of $X^4$ to $X^6$ is atom N, and at least one of $X^7$ to $X^9$ is atom N, $R^1$ to $R^9$ and R' are independently hydrogen, deuterium, a halogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C2 to C30 alkenyl group, a substituted or unsubstituted C6 to C30 aryl group, a substituted or unsubstituted C1 to C30 heteroaryl group, a substituted or unsubstituted C1 to C30 amino group, $SF_5$, a trialkylsilyl group having a substituted or unsubstituted C1 to C30 alkyl group, a dialkylarylsilyl group having a substituted or unsubstituted C1 to C30 alkyl group and a C6 to C30 aryl group, a triarylsilyl group having a substituted or unsubstituted C6 to C30 aryl group, a substituted or unsubstituted diaryl boronyl, or $R^1$ to $R^9$ are fused to form a fused ring, n and m are independently integers ranging from 0 to 2, and m+n≤3.

4. The organometallic complex of claim 1, wherein the cyclometalating ligand (CyN—CyC) is one of chemical formulae:

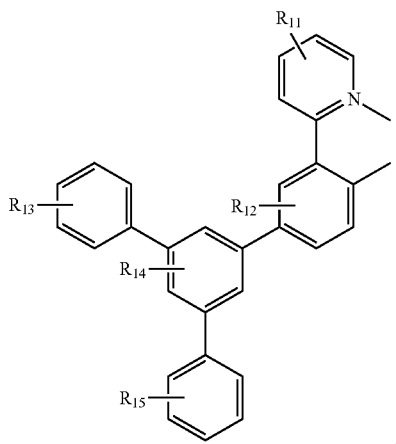

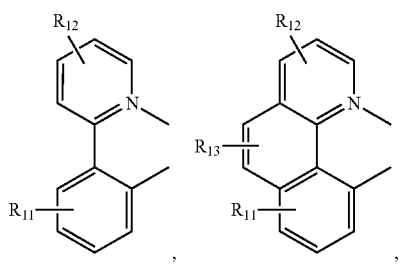

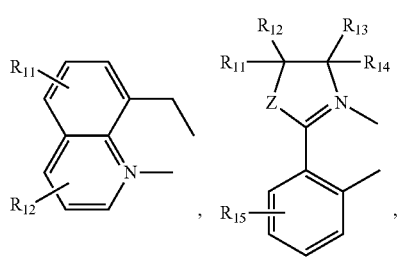

-continued
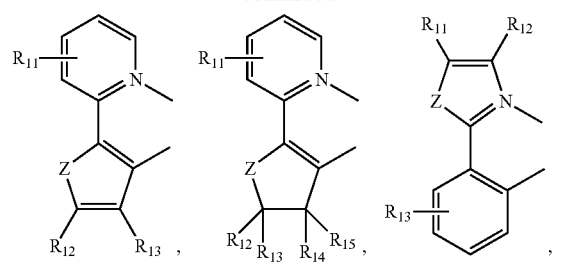
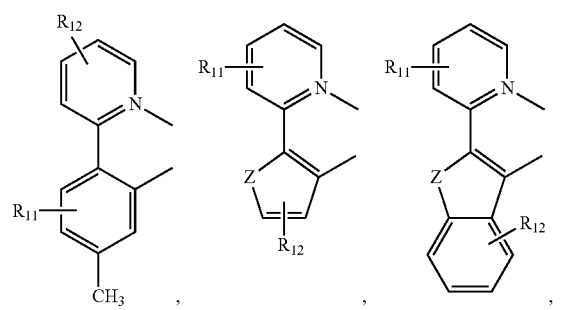
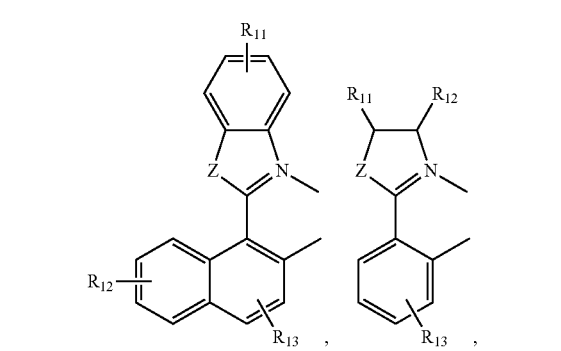
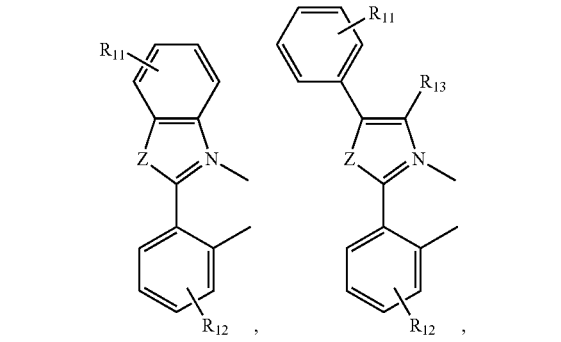
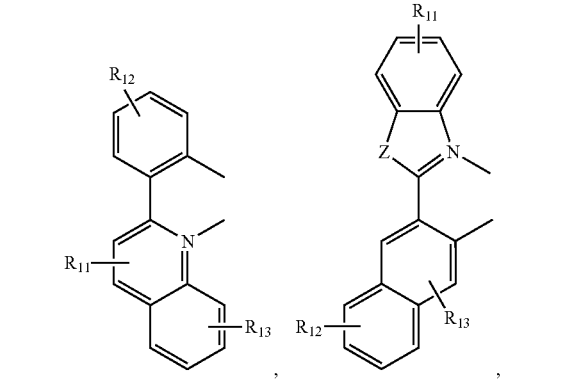
-continued
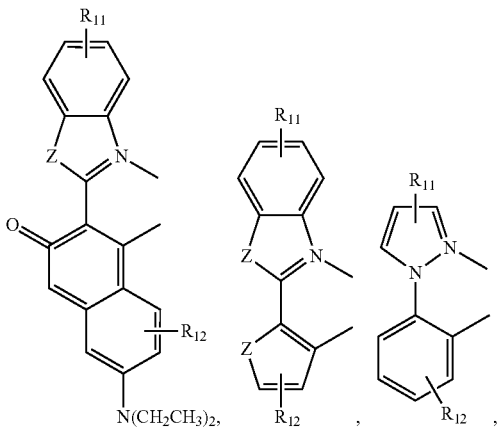
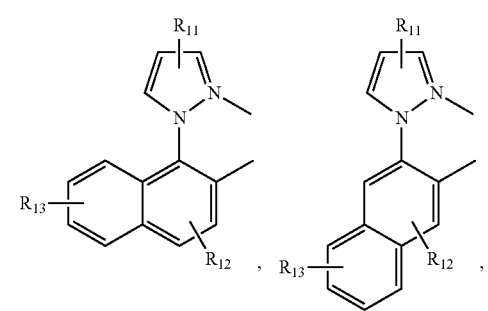
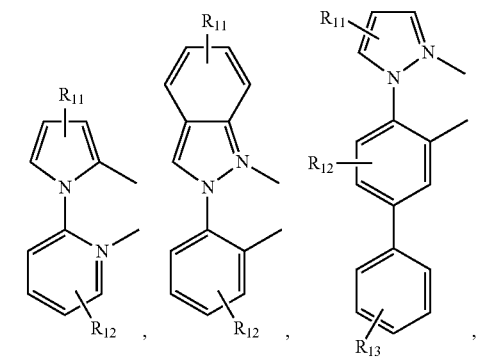
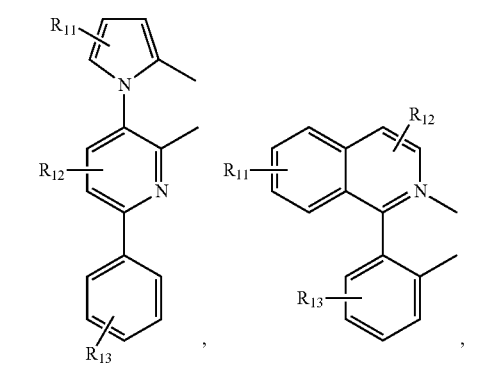

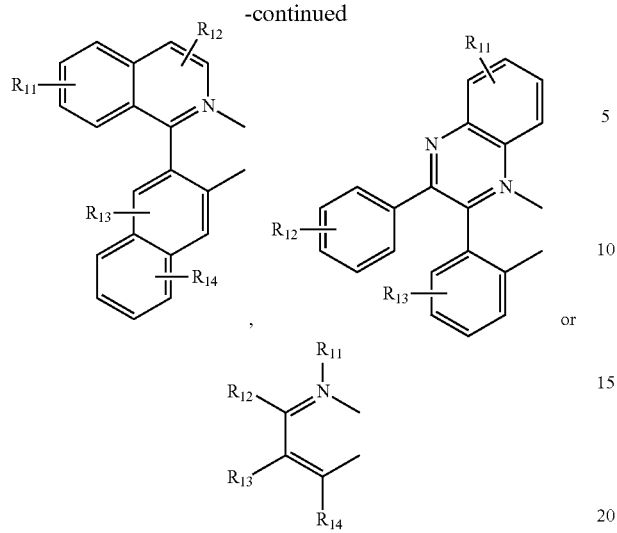

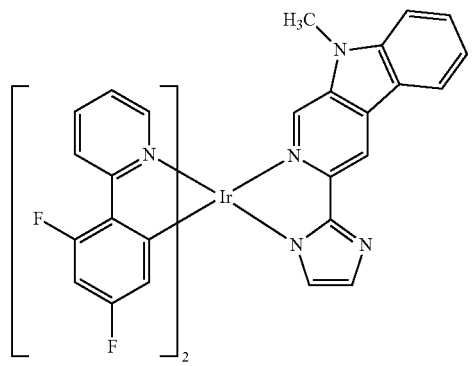

Chemical Formula A-1

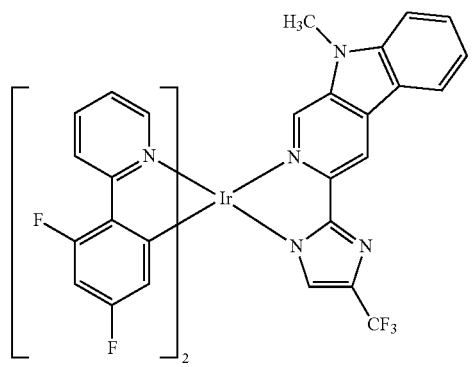

Chemical Formula A-2

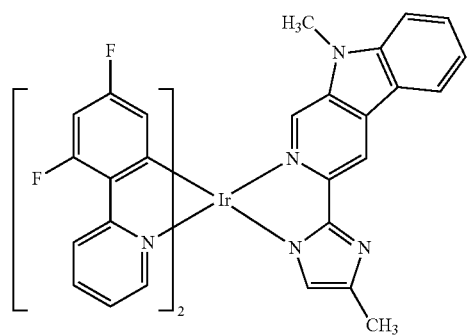

Chemical Formula A-3]

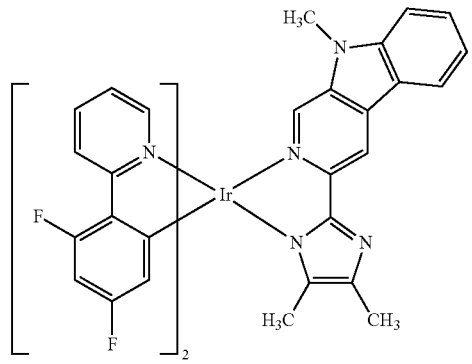

[Chemical Formula A-4]

wherein, in the above chemical formulae, $R^{11}$, $R^{12}$, $R^{13}$, $R^{14}$, and $R^{15}$ are independently a monosubstituted or multisubstituted group, hydrogen, a halogen, —OR, —N(R)$_2$, —P(R)$_2$, —POR, —PO$_2$R, —PO$_3$R, —SR, —Si(R)$_3$, —B(R)$_2$, —B(OR)$_2$, —C(O)R, —C(O)OR, —C(O)N(R), —CN, —NO$_2$, —SO$_2$, —SOR, —SO$_2$R, —SO$_3$R, a C1 to C20 alkyl group, or a C6 to C20 aryl group, wherein R is hydrogen, deuterium, a halogen, a substituted or unsubstituted C1 to C20 alkyl group, a substituted or unsubstituted C1 to C10 alkoxy group, a substituted or unsubstituted C2 to C20 alkenyl group, a substituted or unsubstituted C2 to C20 alkynyl group, a substituted or unsubstituted C1 to C20 heteroalkyl group, a substituted or unsubstituted C6 to C40 aryl group, a substituted or unsubstituted C7 to C40 arylalkyl group, a substituted or unsubstituted C7 to C40 alkylaryl group, a substituted or unsubstituted C2 to C40 heteroaryl group, or a substituted or unsubstituted C3 to C40 heteroarylalkyl group, and Z is S, O, or NW$^0$ wherein R$^0$ is hydrogen or a C1 to C20 alkyl group.

5. The organometallic complex of claim 1, wherein the M is Ir or Pt.

6. The organometallic complex of claim 1, wherein at least two of $X^1$ to $X^3$ are nitrogen atoms.

7. The organometallic complex of claim 1, wherein all of $X^1$ to $X^3$ are nitrogen atoms.

8. The organometallic complex of claim 2, wherein at least two of $X^1$ to $X^3$ are nitrogen atoms, and at least two of $X^4$ to $X^6$ are nitrogen atoms.

9. The organometallic complex of claim 2, wherein all of $X^1$ to $X^3$ are nitrogen atoms, and all of $X^4$ to $X^6$ are nitrogen atoms.

10. The organometallic complex of claim 3, wherein at least two of $X^1$ to $X^3$ are nitrogen atoms, at least two of $X^4$ to $X^6$ are nitrogen atoms, and at least two of $X^7$ to $X^9$ are nitrogen atoms.

11. The organometallic complex of claim 3, wherein all of $X^1$ to $X^3$ are nitrogen atoms, all of $X^4$ to $X^6$ are nitrogen atoms, and all of $X^7$ to $X^9$ are nitrogen atoms.

12. The organometallic complex of claim 1, wherein the compound represented by the above Chemical Formula 1 is represented by one of Chemical Formulae A-1 to A-7:

Chemical Formula A-5

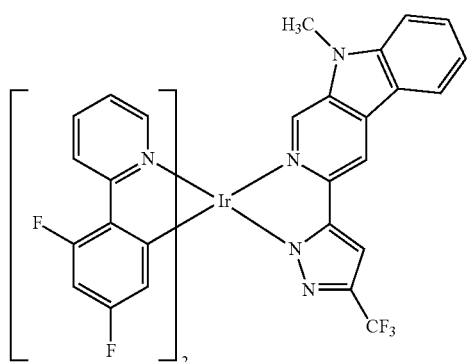

Chemical Formula A-6

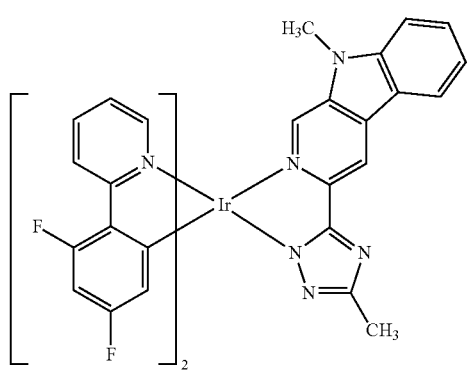

Chemical Formula A-7

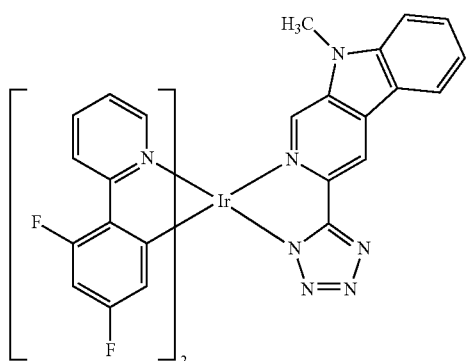

13. An organic electroluminescence device, comprising an organic layer between a pair of electrodes, wherein the organic layer includes the organometallic complex according to claim 1.

14. The organic electroluminescence device of claim 13, wherein the organic layer is an emission layer.

15. The organic electroluminescence device of claim 14, wherein the organometallic complex is included in an amount of about 1 to about 30 parts by weight based on 100 parts by weight of an emission layer-forming material.

16. A display device comprising the organic electroluminescence device according to claim 13.

* * * * *